US005798546A

United States Patent [19]
Watsuji et al.

[11] Patent Number: 5,798,546
[45] Date of Patent: *Aug. 25, 1998

[54] NONVOLATILE SEMICONDUCTOR DEVICE

[75] Inventors: Yukihiro Watsuji; Akira Maruyama, both of Suwa, Japan

[73] Assignee: Seiko Epson Corporation, Tokyo, Japan

[ * ] Notice: The term of this patent shall not extend beyond the expiration date of Pat. No. 5,475,249.

[21] Appl. No.: 518,996

[22] Filed: Aug. 24, 1995

Related U.S. Application Data

[62] Division of Ser. No. 72,396, Jun. 7, 1993, Pat. No. 5,475,249.

[30] Foreign Application Priority Data

| Jun. 9, 1992 | [JP] | Japan | 4-149530 |
| Jun. 15, 1992 | [JP] | Japan | 4-155083 |
| Jun. 3, 1993 | [JP] | Japan | 5-160076 |

[51] Int. Cl.$^6$ ............... H01L 29/788; H01L 29/76; G11C 11/34; G11C 7/00
[52] U.S. Cl. ............... 257/316; 257/314; 257/319; 257/320; 365/189.07; 365/191; 365/218
[58] Field of Search ............... 257/316, 314, 257/319, 320; 365/185.22, 185.24, 185.29, 185.3, 189.07, 191, 900, 218

[56] References Cited

U.S. PATENT DOCUMENTS

| 4,949,309 | 8/1990 | Rao | 365/218 |
| 4,956,816 | 9/1990 | Atsumi et al. | 365/201 |
| 5,142,496 | 8/1992 | Van Buskirk | 365/201 |
| 5,185,718 | 2/1993 | Rinerson et al. | 365/185.01 |
| 5,241,507 | 8/1993 | Fong | 365/218 |
| 5,247,346 | 9/1993 | Hazani | 257/314 |
| 5,247,478 | 9/1993 | Gupta et al. | 365/185.01 |
| 5,274,599 | 12/1993 | Ema | 365/218 |
| 5,287,317 | 2/1994 | Kobayashi et al. | 365/218 |
| 5,475,249 | 12/1995 | Watsuji et al. | 257/316 |

FOREIGN PATENT DOCUMENTS

| 62-60266 | 3/1987 | Japan | 365/185.01 |
| 1-259556 | 10/1989 | Japan | 365/185.01 |
| 1-294297 | 11/1989 | Japan | 365/218 |
| 2-5296 | 1/1990 | Japan | 365/185.01 |
| 2-123597 | 5/1990 | Japan | 365/185.01 |
| 2-308500 | 12/1990 | Japan | 365/218 |
| 3-230397 | 10/1991 | Japan | 365/185.29 |
| 4-21998 | 1/1992 | Japan | 365/185.01 |
| 4-3395 | 1/1992 | Japan | 365/185.3 |
| 4-275457 | 10/1992 | Japan | 365/185.01 |

*Primary Examiner*—Steven H. Loke
*Attorney, Agent, or Firm*—Oliff & Berridge, PLC

[57] ABSTRACT

Erasing operation can be carried out by applying a given potential difference between the control gate electrodes and the source regions in memory transistors 1a–1d by a potential difference setting section 30. Verifying operation can be accomplished by delecting the threshold voltages of the memory transistors 1a–1d by a verify circuit 8. The potential difference setting section 30 can respond to Detect signals from the verify circuit 8, that is, to the threshold voltages of the memory transistors to control the application time of potential difference or the magnitude of potential difference. In such a manner the overerasing can effectively be prevented and the erasing time can be optimized.

10 Claims, 16 Drawing Sheets

FIG. I

NONVOLATILE SEMICONDUCTOR DEVICE

This is a Division of application Ser. No. 08/072,396 filed Jun. 7, 1993, now U.S. Pat. No. 5,475,249.

BACKGROUND OF THE INVENTION

1. Field of the Invention

The present invention relates to a nonvolatile semiconductor device, particularly, for write/erase control of a flash EEPROM.

2. Description of the Related Art

FIG. 15 shows a cross-sectional view of a memory transistor in a flash EEPROM. Data is written in the memory transistor by simultaneously applying a high voltage lo a control gate electrode 17 and drain region 15 while setting a source region 14 at GND level. Such a setting will cause a voltage sufficient to create an avalanche breakdown to be applied between the drain region 15 and a substrate 21. Since the high voltage is also applied to the control gate electrode 17 only hot electrons in hot carriers produced by the avalanche breakdown are selectively injected into a floating gate electrode 16. Thus the threshold voltage in the memory transistor as viewed from the control gate electrode 17 increases to permit the write of data.

Data can be erased by setting the control gate electrode 17 at GND level and the drain region 15 at Open level (or GND level) and also by applying the high voltage to the source region 14. In other words, when the high voltage is applied to the source region 14 electrons in the floating gate electrode 16 tunnel a thin gate oxide film 19 between the source region 14 and the floating gate electrode 16. Thus, the electrons are drawn from the floating gate electrode 16 into the source region 14. As a result, the threshold voltage of the memory transistor as viewed from the control gate electrode 17 will decrease to permit the erase of data.

FIG. 16 shows a circuit diagram of a nonvolatile semiconductor device constructed in accordance with the prior art. The nonvolatile semiconductor device of FIG. 16 is shown to be of four-transistor type for simplification.

The write operation will first be described. When the write is to be made in a memory transistor 1a, node a and b and the output Y1 or a Y-selector 803 are set at 11 level (upper logical inversion level); a node c and the output Y2 of the Y-selector 803 are set at L level (lower logical inversion level); the output WL1, of an X-decoder 802 is set at high-voltage Vpp level and the output WL2 of the X-decoder 802 is set at GND level. Furthermore, a write control circuit 804 is set to output the Vpp level. Thus, transistors 40, 42 and 48 are turned on and transistors 29, 44 and 46 are turned off. BL1 and WL1 are set at Vpp level; BL2 is set at Open level; and WL2 and SL are set at GND level. By such a setting, the potential of the memory transistor 1a at its drain region and control gate electrode will only be Vpp level. As a result, only the memory transistor 1a generates hot electrons at the drain region end so that the electrons will be injected into the floating gate electrode to permit the write operation. In such a case, the other memory transistors 1b, 1c and 1d will not make the writing operation since no channel current is produced therein.

The erase operation will be then described. The node a is set at L level; the outputs Y1 and Y2 of the Y-selector 803 are set at L level; and the outputs WL1 and WL2 of the X-decoder 802 are set at GND level. When an erase pulse is applied to the node c under such a condition, the pulse signal is inputted into a transistor 29 through an inverter 32 and interface circuit 84. As a result, the transistor 29 is turned on and a source line SL becomes Vpp level. In the memory transistors 1a–1d, thus, BL1 and BL2 are set at Open level; WL1 and WL2 are set at GND level; and SL is set at Vpp level. A tunnel current is then produced between the floating gate electrode and the source region. As a result, electrons are released from the floating gate electrode to the source region. The erasure will be thus made in the memory transistors 1a–1d.

Data can be read out by setting the node b at L, level and also by detecting the potential of the bit line BL1 or BL2 through a sense amplifier 822.

If the electrons are too much drawn from the floating gate electrode 16 into the source region 14 in the above erasure, however, the threshold voltage in the memory transistors will be negative. Such a phenomenon is known as "overerasing". In the overerasing, the read-out of data generates a leak current in the memory transistors so that they will not properly be operated. In order to prevent the overerasing, a technique known as "verify" may be used. In the verify operation, the threshold voltage of a memory transistor to he erased is monitored to judge whether or not the threshold voltage is in a given proper range after the erase operation. Such judgment is accomplished by comparing the threshold voltage of the memory transistor to he erased with a predetermined reference voltage (which will be called "verify voltage"). More particularly, if the threshold voltages of all the memory transistors to be erased are equal to or lower than the verify voltage, it is judged that the erasure for the memory transistors has been properly performed. The subsequent erasure is ceased. On the other hand, even if the threshold voltage in only one of the memory transistors to he erased is higher than the verify voltage, it is judged that the erasure has not properly been made. The erasing operation is again performed before the verifying operation is again carried out. Such a procedure will be repeated until all the memory transistors have been erased properly.

If the threshold voltages in all the memory transistors are equal to or lower than the verify voltage, the subsequent erasure will be ceased. Therefore, an overerasing may probably be created in a faster erase speed memory transistor, that is, a memory transistor that its threshold voltage is more largely shifted lo the negative direction in the erase operation.

The verify technique of the prior art can make the erasure only with the same erasing voltage and only through the same erasing time period. In order to prevent the overcrasing, the erasing voltage can be reduced with the erasing lime period to decrease the shirt of the threshold voltage in the memory transistor to the negative direction. If the shift of the threshold voltage to the negative direction is too much reduced, the erasing operation will undesirably require more lime. On the contrary, if the erasing voltage is increased with increase of the erasing lime period lo increase the speed of erasure, the possibility of overerasing will be highly increased. Therefore, the erasing voltage and time period must properly be controlled. A technique of controlling the erasing voltage is disclosed as by Japanese Patent laid-Open No. Hei 2-123597. Such a technique can satisfactorily prevent the characteristics of a memory transistor to be degraded by repetition of the write/erase, but not overcome the above problem of overerasing in the verify and other operations. The prior art does not comprise any means for preventing the overerasing in the verify and other operations. Another technique of control the erasing time period is disclosed as by Japanese Patent Laid-Open No. Hei 2-5296. The object of this technique is also to prevent the characteristics of a memory transistor from being degraded by repetition of the write/erase. The erasure time control process provided by Japanese Patent Laid-Open No. Hei 2-5296 is adapted to limit the erasing time period through the provision of a timer circuit and not suitable for use in prevention of the overerasing.

SUMMARY OF THE INVENTION

In order to overcome the above problems of the prior art, an object of the present invention is lo provide a nonvolatile semiconductor device which can limit the dispersion in the distribution of threshold voltage of a memory transistor due to release of electrons (that is, "erasure") within an appropriate range and which can optimize the erasing time period.

To this end, the present invention provides a nonvolatile semiconductor device comprising a floating gate electrode, a control gate electrode, first and second diffusion layers a memory transistor for performing injection and release of electrons relative to said floating gate electrode to make storage of data, potential difference setting means for setting a potential difference between said control gate electrode and said first diffusion layer on the release of electrons, and verifying means for monitoring the threshold voltage after the release of electrons to detect the threshold voltage of said memory transistor said potential difference setting means being responsive to the result of threshold voltage detected by said verifying means to control time required by the application of potential difference.

The nonvolatile semiconductor device of the present invention can cause the verifying means to detect the threshold voltage of the memory transistor after the release of electrons has been performed by the potential difference setting means. The potential difference setting means is responsive to the detected threshold voltage to control lime required to apply the potential difference to the memory transistor. Thus, the amount of erase in the memory transistor can be controlled depending on the threshold voltage after erasure. As a result, the dispersion in the distribution of threshold voltage after the erasure can be limited within an appropriate range to prevent an overerasing in an effective manner and also to optimize the erasing time period.

The control of the potential difference setting means may be made such that the application time of potential difference decreases as the threshold voltage detected by the verifying means decreases. Thus, the amount of erasure or the shift of the threshold voltage to the negative direction can be reduced with decrease of the threshold voltage. As a result, the threshold voltage can easily be controlled after the erasure to limit the dispersion in the distribution of threshold voltage within an appropriate range. This can prevent the overerasing to improve the yield and reliability of the nonvolatile semiconductor device.

The potential difference setting means may control the application time of potential difference such that after potential difference has been set to provide the application lime having a given length, the application time of potential difference is reduced as the threshold voltage detected by the verifying means decreases. Such a control can cause the threshold voltage of the memory transistor due to the initial application of potential difference to approach the desired level to some degree. This can optimize the erasing time period.

The present invention also provides a nonvolatile semiconductor device comprising a floating gate electrode, a control gate electrode, first and second diffusion layers, a memory transistor for performing injection and release of electrons relative to said floating gate electrode to make storage of data, potential difference setting means for setting a potential difference between said control gate electrode and said first diffusion layer on the release of electrons, and verifying means for monitoring the threshold voltage after the release of electrons to detect the threshold voltage of said memory transistor, said potential difference setting means being responsive to tile result of threshold voltage detected by said verifying means to control the magnitude of potential difference to be applied.

In accordance with the nonvolatile semiconductor device or the present invention, the potential difference setting means can respond to the detected threshold voltage to control the magnitude of the potential difference to be applied to the memory transistor. The amount of erase in the memory transistor can be controlled depending on the threshold voltage after erasure. As a result, the dispersion in the distribution of threshold voltage after erasure can be limited within an appropriate range so that the overerasing can effectively be prevented with the erasing time period optimized.

The control of the potential difference setting means may be made such that the potential difference decreases with decrease of the threshold voltage detected by the verifying means. Thus, the shift of the threshold voltage to the negative direction can be reduced with decrease of the threshold voltage. As a result, the threshold voltage can easily be control led after the erasure to limit the dispersion in the distribution of threshold voltage within an appropriate range. This can prevent the overerasing to improve the yield and reliability of the nonvolatile semiconductor device.

The potential difference setting means may control the potential difference such that after a given magnitude of potential difference has been set, the potential difference is reduced as the threshold voltage detected by the verifying means decreases. Such a control can cause the threshold voltage of the memory transistor due to the initial application of potential difference to approach the desired level to some degree. This can optimize the erasing lime period.

Furthermore, the potential difference setting means may control both the application lime and magnitude or potential difference. This enables less hardwares to control more patterns.

The present invention further provides a nonvolatile semiconductor device comprising a floating gate electrode a control gate electrode, first and second diffusion layers a memory transistor for performing injection and release of electrons relative to said floating gate electrode to make storage of data and potential difference setting means for setting a potential difference between said control gate electrode and said first diffusion layer on the release of electrons, said potential difference setting means being adapted to set an application time of potential difference reduced as the release of electrons proceeds.

In the nonvolatile semiconductor device of the present invention the erasing operation can be performed by setting that the application time of potential difference is reduced as the threshold voltage of the memory transistor decreases. Thus, the shift or the threshold voltage to the negative direction can be reduced as the threshold voltage decreases with proceeding of the erasure. This can also effectively prevent the overerasinig in the memory transistor. Particularly, due to the fact that the difference between threshold voltage of slower erase speed memory transistors and that of faster erase speed memory transistors gets smaller as the erasing operation proceeds, it can be minimized that the dispersed distribution of threshold voltage due to variations in the process adversely affects the nonvolatile semiconductor device. As a result, the yield and reliability of the nonvolatile semiconductor device can greatly be improved.

If the nonvolatile semiconductor device of the present invention further comprises erasure halt means adapted to detect the threshold voltage of the memory transistor on the erasing operation and responsive to the detected threshold voltage to equalize the potential applied between the control gate electrode and the first diffusion layer, thereby automatically halting the erasing operation, the overerasing can effectively be prevented.

The present invention further provides a nonvolatile semiconductor device comprising a floating gate electrode, a control gate electrode, first and second diffusion layers, a memory transistor for performing injection and release of electrons relative to said floating gate electrode to make storage of data, and potential difference setting means for setting a potential difference between said control gate electrode and said first diffusion layer on the release of electrons, after a potential difference has been set to provide a predetermined period of potential difference application time, said potential difference setting means being adapted to reduce the application time of potential difference to he set as the release of electrons proceeds.

The nonvolatile semiconductor device of the present invention can cause the threshold voltage of the memory transistor due to the initial application of potential difference to approach the desired level to some degree. This can optimize the erasing time period.

The present invention further provides a nonvolatile semiconductor device comprising a floating gate electrode, a control gate electrode, first and second diffusion layers, a memory transistor for performing injection and release of electrons relative to said floating gate electrode to make storage of data, and potential difference setting means for setting a potential difference between said control gate electrode and said first diffusion layer on the release of electrons, said potential difference setting means being adapted to reduce potential difference to be set as the release of electrons proceeds.

In the nonvolatile semiconductor device of the present invention, the erasing operation can be performed by setting that the potential difference is decreased as the threshold voltage of the memory transistor decreases. Thus, the shift of the threshold voltage to the negative direction can be reduced as the threshold voltage decreases with proceeding of the erasure. This can also effectively prevent the overerasing in the memory transistor. As a result, the yield and reliability of the nonvolatile semiconductor device can greatly be improved.

The present invention further provides a nonvolatile semiconductor device comprising a floating gate electrode, a control gate electrode, first and second diffusion layers, a memory transistor for performing injection and release of electrons relative to said floating gate electrode to make storage of data, and potential difference setting means for setting a potential difference between said control gate electrode and said first diffusion layer on the release of electrons, after a predetermined magnitude of potential difference has been set, said potential difference setting means being adapted to reduce the potential difference to be set as the release of electrons proceeds.

The nonvolatile semiconductor device of the present invention can cause the threshold voltage of the memory transistor due to the initial application of potential difference to approach the desired level to some degree. This can optimize the erasing time period.

The present invention further provides a nonvolatile semiconductor device comprising a floating gate electrode, a control gate electrode, first and second diffusion layers, a memory transistor for performing injection and release of electrons relative to said floating gate electrode to make storage of data, and potential difference setting means for setting a potential difference between said control gate electrode and said first diffusion layer on the release of electrons, said potential difference setting means being adapted to reduce the application time of potential difference to be set and to decrease the potential difference to be set as the release of electrons proceeds.

The present invention further provides a nonvolatile semiconductor device comprising a floating gate electrode, a control gate electrode, first and second diffusion layers, a memory transistor for performing injection and release of electrons relative to said floating gate electrode to make storage of data, and potential difference setting means for setting a potential difference between said control gate electrode and said first diffusion layer on the release of electrons, after a predetermined period of application time and a predetermined magnitude of potential difference have been set, said potential difference setting means being adapted to reduce the application time of potential difference to be set and to decrease the potential difference to be set as the release of electrons proceeds.

Thus, the nonvolatile semiconductor device of the present invention can perform the erasure while varying both the application time and magnitude of potential difference. This enables less hardwares to erase more patterns.

DETAILED DESCRIPTION OF THE PREFERRED EMBODIMENTS

(1) First Embodiment

Figure 1:
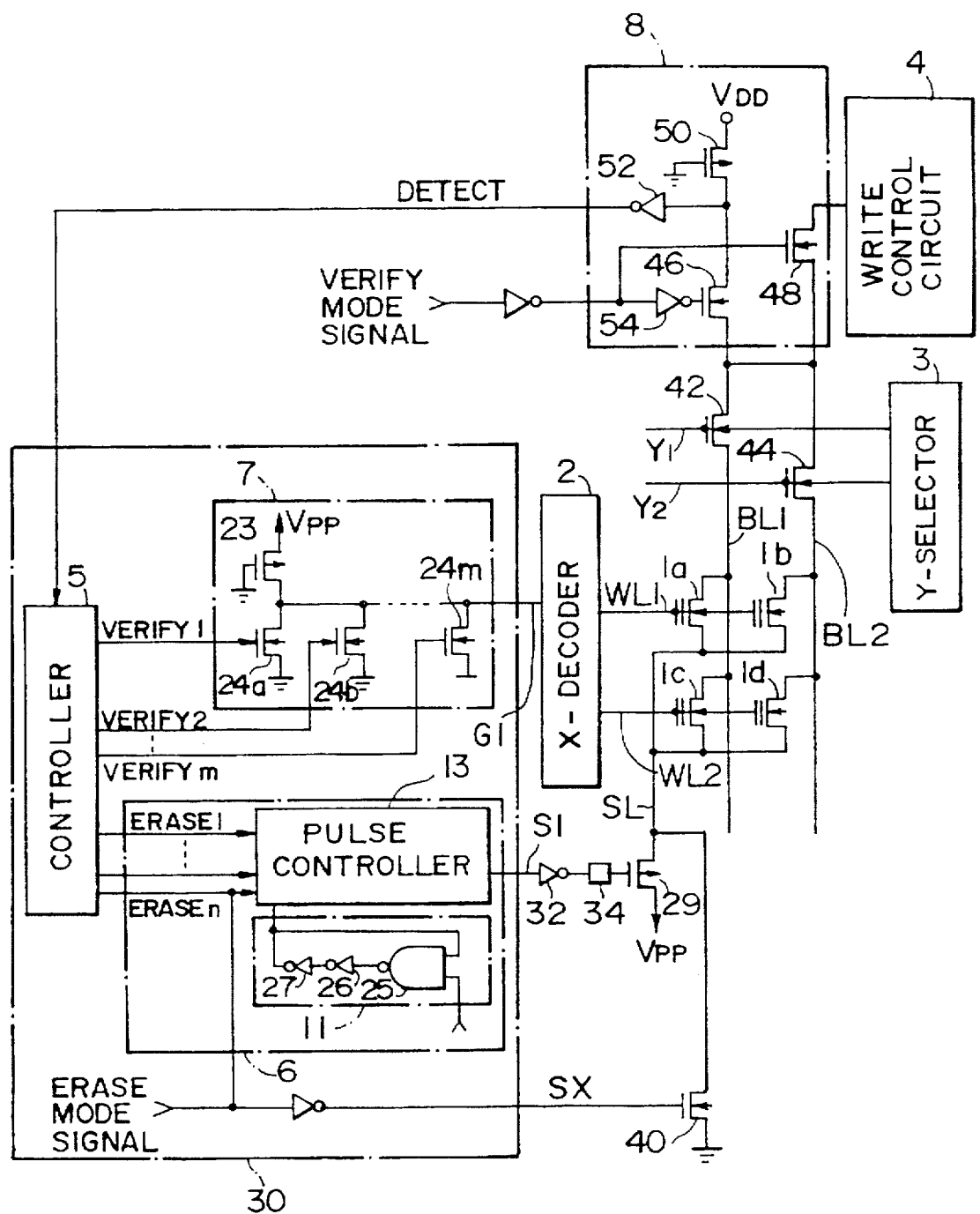
FIG. 1 is a circuit diagram of the first embodiment of a nonvolatile semiconductor device constructed in accordance with the present invention.

FIG. 1 shows the first embodiment of a nonvolatile semiconductor device constructed in accordance with the present invention which is conveniently shown to comprise four memory transistors $1a$–$1d$. However the nonvolatile semiconductor device may actually have a memory section which comprises a desired number of memory transistors arranged in a matrix. In the following description, further, the release of electrons will be called "erasing" while the injection of electrons will be called "writing". However, even if the release and injection of electrons are contrarily called "writing" and "erasing" respectively as will be described, it will not change the essentials of the present invention.

The first embodiment shown in FIG. 1 comprises memory transistors $1a$–$1d$, an X-decoder 2, a Y-selector 3, a write control circuit 4, a verify circuit 8, a potential difference setting section 30, transistors 29, 40, 42 and 44, an inverter 32, and an interface circuit 34. The interface circuit 34 functions to transform a voltage amplitude input of Vdd-GND into a voltage amplitude output of Vpp-GND.

The memory transistors $1a$–$1d$ is selected by the X-decoder and Y-selector 2, 3. The X-(decoder 2 supplies word line signals WL1 and WL2 to the control gates of the memory transistors $1a$–$1d$. The potential of the word line signals WL1 and WL2 is set by a signal GI from a gate potential setting section 7. The Y-selector 3 supplies Y-selector signals Y1 and Y2 to the transistors 42 and 44 which in turn select bit lines BL1 and BL2.

The write control circuit 4 controls the writing to the selected one of the memory transistors. The verify circuit 8 detects the threshold voltages of the memory transistors $1a$–$1d$ on the verifying operation, that is, when a verify mode signal is at If level. The verify circuit 8 comprises N-ch transistors 46, 48 for selecting the verifying operation, a pull-up P-ch transistor 50 and inverters 52 and 54. When each of the memory transistors is energized on the verifying operation of the verify circuit 8. Detect signal becomes H level to detect the threshold voltage or that memory transistor.

The potential difference setting section 30 comprises a control part 5, a source potential setting part 6 and a gate potential settling part 7. A potential diffidence between the control gate electrodes and the source regions in the memory transistors $1a$–$1d$ is set by signals G1, S1 and SX.

The control part 5 generates Verify 1–Verify m signals and Erase 1–Erase n signals which are used to control the gate potential setting part 7 and source potential setting part 6 and also receives Erase Mode signal and Detect signal from the verify circuit 8. Erase Mode signal is used to set the erasing operation when it is at H level.

The gate potential setting part 7 is responsive to Verify 1–Verify m signals from the control part 5 to set the potential in the control electrodes of the memory transistors. The gate potential setting part 7 comprises a pull-up P-ch transistor 23 and N-ch transistors 24$a$–24$m$ which are manufactured to have different threshold voltages. On the verifying operation, therefore, these transistors can be responsive to the Verify 1–Verify m signals to set different verify voltages at the signal G1.

The source potential settling part 6 comprises a pulse generator circuit It and a pulse controller 13 and functions to output the signals S1 and SX to the transistors 29 and 40 such that the source potentials of the memory transistors $1a$–$1d$ will be set. The pulse generator circuit 11 comprises a NAND 25 and inverters 26 and 27, which components co-operate with each other to generate a reference pulse waveform having a given width. The pulse controller 13 is responsive to the reference pulse waveform from the pulse generator It and the control signals Erase 1–Erase n from the control part 5 to form a given pulse waveform which in turn is outputted from the pulse controller 13 as a signal S1. This signal S1 co-operates with a signal SX provided by inverting the Erase Mode signal to perform ON/OFF control of the transistors 29 and 40 such that the potential on a source line SL will be set. The signal S1 is inverted hy the inverter 32 and changed in voltage amplitude before it is inputted into the transistor 29.

The operation of the first embodiment will now be described. The writing is carried out by the write control circuit 4 and will not be described in detail herein.

First of all, the erasing will be described. On the erasing operation, Erase Mode signal is set at H level while Verify Mode signal is set at L level. Outputs Y1 and Y2 of the Y-selector 3 are set al L level while outputs WL1 and WL2 or the X-decoder 2 are set at GND level. Thus, the potentials in the drain regions of the memory transistors $1a$–$1d$ are set at Open level while the potential of the control gate electrodes are set at GND level. Under such a condition, the signal S1 having a given waveform is inputted into the transistor 29 through the inverter 32 and interface circuit 34. Each lime when the signal S1 becomes H level, the source line SL will be Vpp level to erase the memory transistors $1a$–$1d$.

Figure 2:
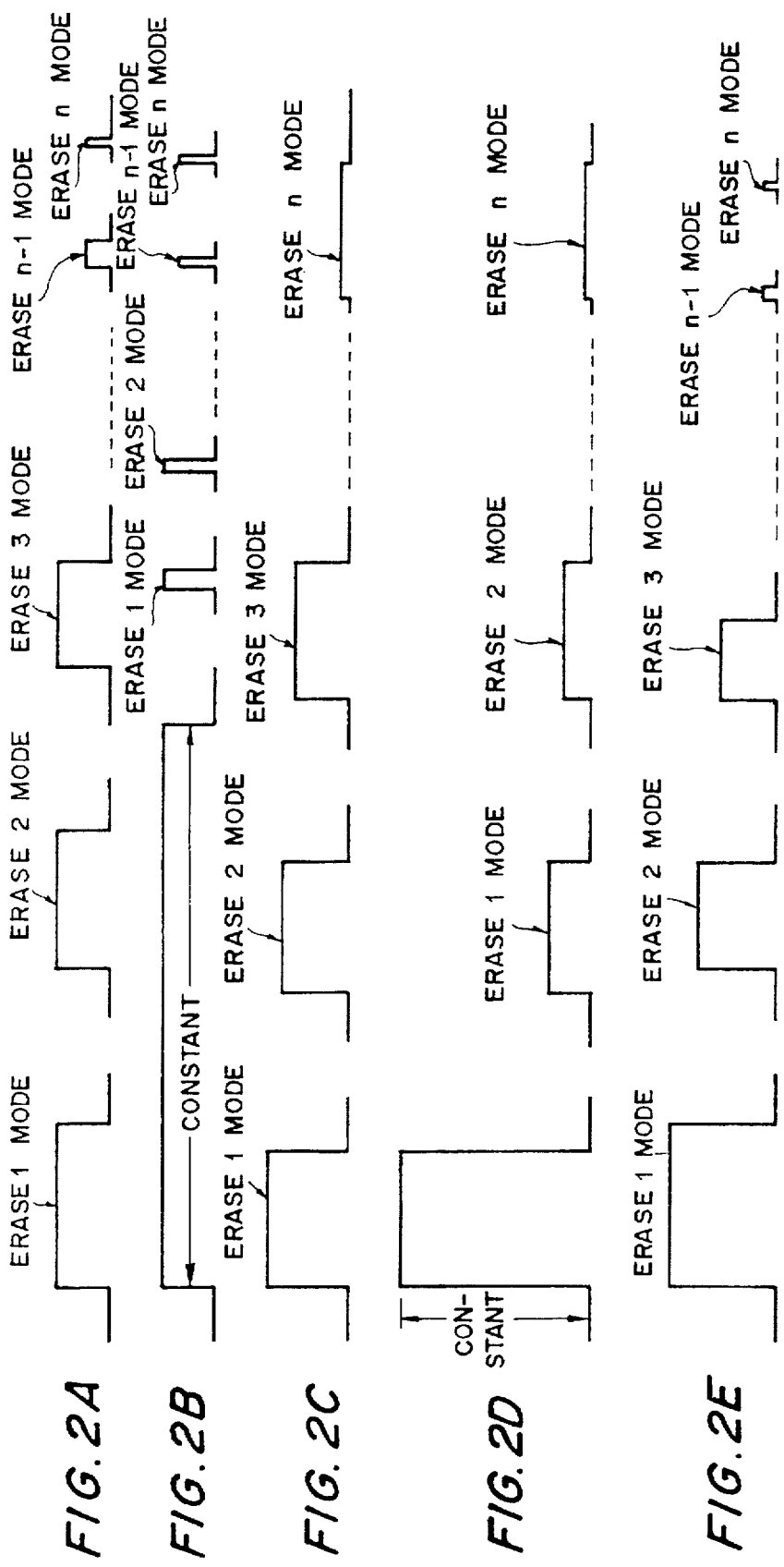
FIGS. 2A–2E are diagrams showing waveforms that represent various potential differences settable in a memory transistor.

FIG. 2A shows a waveform of the potential difference applied to the memory transistors $1a$–$1d$ when the erasing operation is made in the above manner. The waveform is formed to decrease its width as Erase 1 mode is being changed to Erase n mode. Erase 1–Erase n signals for setting the Erase 1–Erase n modes will be formed by the control part 5 corresponding to Verify 1–Verify m signals. The correspondence between Erase signals and Verify signals may be made in any suitable manner. For example, they may be caused to correspond to each other at 1:1, that is, Verify 1 signal to Erase 1 signal, Verify 2 signal to Erase 2 signal and so on. Further, the Verify and Erase signals may be caused to correspond to each other such that Verify 1 signal corresponds to Erase 1, 2 and 3 signals and Verify 2 signal corresponds to Erase 4 signal.

The verifying operation will now be described. It is carried out each time when the aforementioned erasing operation is terminated.

On the verifying operation, the erase mode signal is set at L level while the verify mode signal is sot at H level. Under such a condition, the word line WL1 is first set at a verify voltage VF (Verify 1) by the X-decoder 2. The verify voltage VP (Verify m) represents a verify voltage set corresponding to Verify m signal from the control part 5. The transistor 42 is then selected and turned on by the Y-selector 3 to detect the threshold voltage in the memory transistor 1a. More particularly, if the threshold voltage of the memory transistor 1a becomes tower than the verify voltage VF (Verify 1), an electric current passes through the bit line BL1 and then detected by the verify circuit 8. This renders Detect signal H level. On the contrary, if the threshold voltage or the memory transistor 1a is higher than the verify signal VF (Verify 1), no current will be detected. Thus Detect signal becomes L level.

Since it is recognized that when the Detect signal is at L level, the threshold voltage of the memory transistor 1a is higher than the verify signal VF (Verify 1), the verifying operation is terminated and the erasing operation is re-started. Until the threshold voltage of the memory transistor 1a becomes equal to or tower than the verify signal VF (Verify 1), the erasing and verifying operations will be repeated. If the threshold voltage of the memory transistor 1a becomes equal to or tower than the verify signal VIP (Verify 1) and when the Detect signal becomes H level, the other transistor 44 is selected by the Y-selector 3 to perform the verify operation for the other memory transistor 1b. When the Detect signal is at L level after the verifying operation, the erasing and verifying operation will be repeated until the Detect signal becomes H level as described above.

Next, when the Detect signal becomes H level, the word line WL2 is set at a verify voltage and the transistor 42 is selected by the Y-selector 3 to perform the verify operation for the memory transistor 1c. When the similar erasing and verifying operations for the memory transistor 1c is terminated, the verify operation will be carried out for the next memory transistor 1d.

As Detect signals for all the memory transistors 1a–1d become H level through the above procedure, it is assured that the threshold voltages in all the memory transistors 1a–1d become equal to or tower than the verify voltage VF (Verify 1). The aforementioned erasing and verifying operations will then be carried out such that the threshold voltages in all the memory transistors 1a–1d become equal to or tower than another verify voltage Vf (Verify 2). Such a procedure will sequentially he made for the remaining verify voltages. If the threshold voltages in all the memory transistors 1a–1d become equal to or lower than the last verify voltage VF (Verify m), the erasing operation will completely be terminated.

Finally the verifying operation may he executed with verify voltage or 0 V to check whether or not any one of the memory transistors 1a–1d has been subjected to the overerasing that is whether or not any one of the memory transistors 1a–1d is turned on by such a verify voltage. If it should be found that any one of the memory transistors 1a–1d has been overerased, the erase mode signal is set at L level and the verify mode signal is set at L level. Subsequently, all the transistors 24a–24m in the gate potential setting section 7 are turned off. A voltage higher than the normal voltage Vpp is applied to the control gate electrode of that overerased memory transistor through the X-decoder 2. As a result a tunnel current is produced to perform the write to all the erased memory transistors. Thereafter the erasing operation can be made through time shorter than that of the previous erasure to prevent the overerasing.

Figure 3:
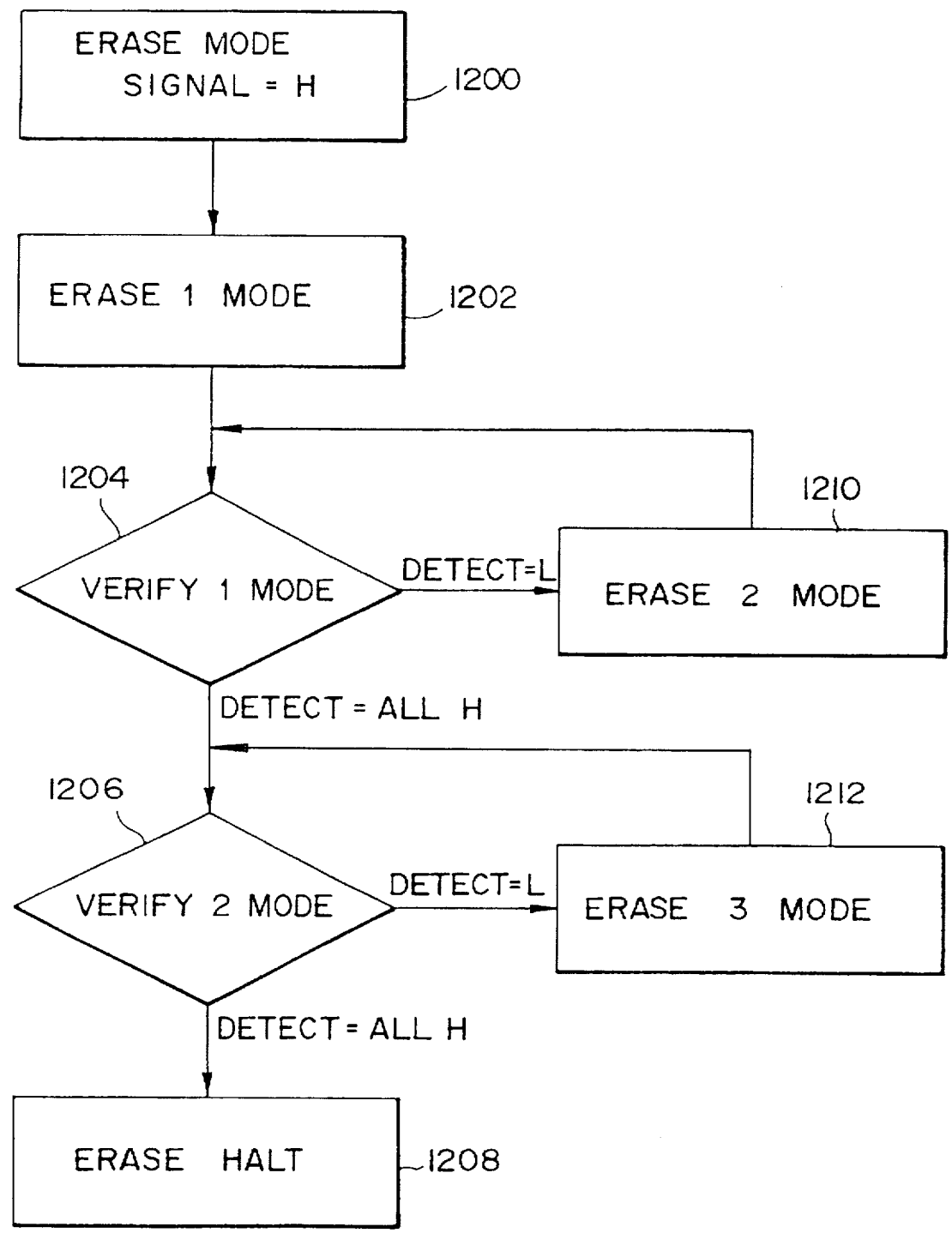
FIG. 3 is a flowchart illustrating one operation in the first embodiment.

FIG. 3 is a flowchart illustrating one operation in the first embodiment and showing three systems of Verify m and Erase n signals (m=n=3).

At step 1200, the erase mode signal is first set at H level. At stop 1202, the control part 5 outputs Erase 1 signal to establish Erase 1 mode. The potential difference having such a pulse waveform as shown in FIG. 2A is applied to the memory transistors 1a–1d to erase them. At step 1204, the control part 5 outputs Verify 1 signal to establish Verify 1 mode. Thus, the signal G1 is set at verify voltage VF (Verify 1) to initiate the verifying operation.

If the threshold voltage of a memory transistor is higher than the verify voltage VF (Verify 1) at the step 1204 and when Detect signal is at L level, the control part 5 outputs Erase 2 signal to establish Erase 2 mode, as shown at step 1210. In such a case, the pulse waveform at Erase 2 mode is shorter than the pulse waveform at Erase 1 mode. After the erasing operation has been made with the pulse waveform of Erase 2 mode, Verify 1 signal is again outputted to establish Verify 1 mode, as shown at step 1204. Thus, the verifying operation will be performed by the verify voltage VF (Verify 1).

Such a procedure is repeatedly performed to all the memory transistors 1a–1d. Once Detect signals corresponding to all the memory transistors 1a–1d become H level, Verify 2 signal is outputted to establish Verify 2 mode and to initiate the verifying operation, as shown at step 1206.

If Detect signal corresponding to any one or the memory transistors on the verifying operation of Verify 2 mode becomes L level, the erasing operation is made in Erase 3 mode, as shown at step 1212. Therefore, the verifying operation is again carried out in Verify 2 mode. When Detect signals corresponding to all the memory transistors 1a–1d become H level, that is, when the threshold voltages of all the memory transistors 1a–1d become equal to or tower than the verify voltage VF (Verify 2), all the erasing operation is halted, as shown at step 1208.

As will be apparent from the above description, the first embodiment can respond to the detected threshold voltage of any one of the memory transistors to control the application lime of potential difference for performing the erasing operation. Therefore, the optimum erasing operation can he carried out depending on the threshold voltage. As shown in FIG. 2A, for example, the control may be made by reducing the pulse width (application time) as the mode is being changed from Erase 1 mode to Erase m mode. In such a manner, the shift of threshold voltage relative to the number of erasing/verifying operations can be reduced less than that of the prior art. As a result, the overerasing can effectively be prevented and the erasing lime finally required can be optimized.

It is now assumed that in FIG. 1 one memory transistor 1a is erased faster than the other memory transistors 1b–1d or that the threshold voltage of the one memory transistor 1a is reduced faster than those of the other memory transistors 1b–1d. This requires that the erasing/verifying operation is executed for the memory transistors 1b–1d after the verifying operation for the memory transistor 1a has been terminated and when it is assured that the threshold voltage of the memory transistor 1a becomes equal to or tower than a given verify voltage VF1. Since the erasing operation is carried out for all the memory transistors 1a–1d, the threshold voltage of the memory transistor 1a will be reduced tower than the verify voltage VF 1 each time when the erasing operation is performed. In the verifying operation of the prior art, the erasing operation can be made only through the same application time. The threshold voltage of the memory transistor 1a may be too reduced tower than 0 V during the erasing operation for the other memory transistors 1b–1d. This may lead to the overerasing in the memory transistor 1a. On the contrary, if each application time is reduced to prevent the overerasing, the erasing time required by all the memory transistors will greatly be increased.

Figure 4A:
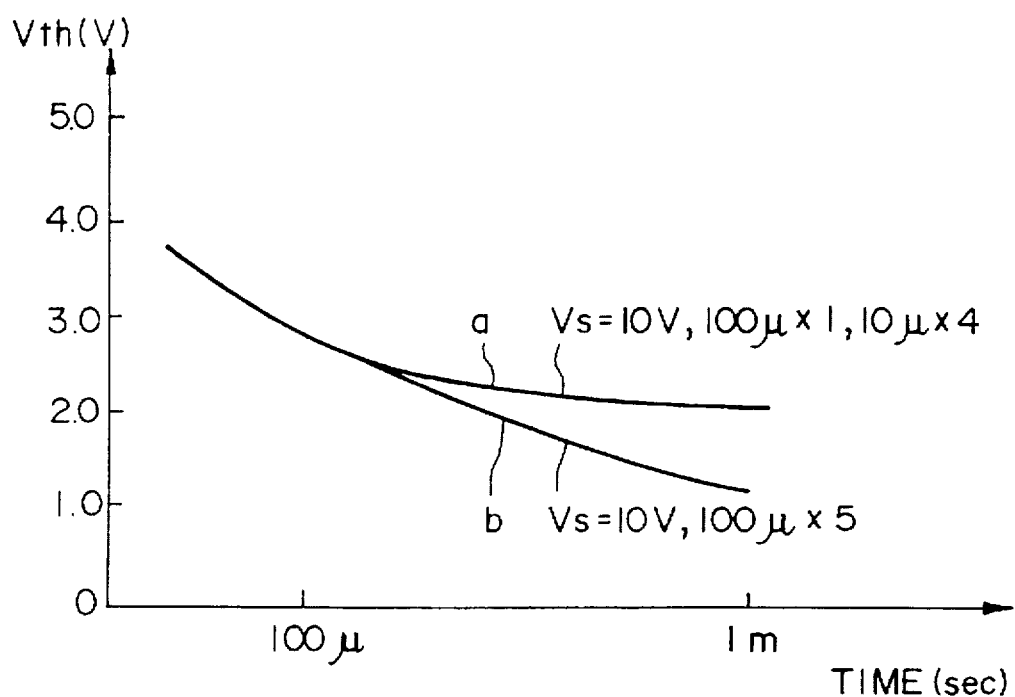
FIGS. 4A and 4B are graphs showing variations in threshold voltage when the erasure is carried out by applying various magnitudes of potential difference to the memory transistor through various lime periods.

In the first embodiment, however, the control can be made by reducing the application time of potential difference as the erasing operation proceeds with the threshold voltage of the memory transistor becoming tower. For example. FIG. 4A shows a characteristic curve a representing variations in threshold voltage when it is set that the potential difference Vs between the control gate electrode and the source region is equal to 10 V and that the application time of potential difference Ts is equal to 100μ and 10μ×4(sec.). FIG. 4A also shows a characteristic curve b representing variations in threshold voltage when the potential difference Vs is equal to 10 V and the application time Ts is equal to 100μ×5 (sec.). As can be seen from FIG. 4A, the characteristic curve a has a gradient smaller than that of the characteristic curve b. If the application time is controlled to be reduced as the threshold voltage decreases as shown by the characteristic curve a, the shift of the threshold voltage can gradually be reduced as the threshold voltage decreases. Such a control can effectively prevent the threshold voltage of a most fastly erasable memory transistor from being reduced equal to or lower than 0 V when a most slowly erasable memory transistor is being subjected to the erasing/verifying operation. In other words, the overerasing can effectively be avoided. In the first embodiment, the initial application time is much larger than that or the prior art and then reduced. Therefore, time required to perform the entire erasing operation can be optimized, compared with the prior art in which the erasing operation can be made only through a constant application time.

The first embodiment may use any suitable waveform of the potential difference applied to the memory transistors 1a–1d, other than that of FIG. 2A. For example, such a waveform as shown in FIG. 2B may be used so that after a pulse waveform having a given length has been initially applied to the memory transistor, the application time is gradually reduced depending on the threshold voltage of the memory transistor. In such a case, the initial pulse waveform to he applied is longer to set the threshold voltage of the memory transistor closer to a desired verify voltage. Thereafter, the erasing operation is carried out with a pulse waveform having very short application time. This can greatly reduced time required to perform the erasing/verifying operation.

(2) Second Embodiment

Figure 6:
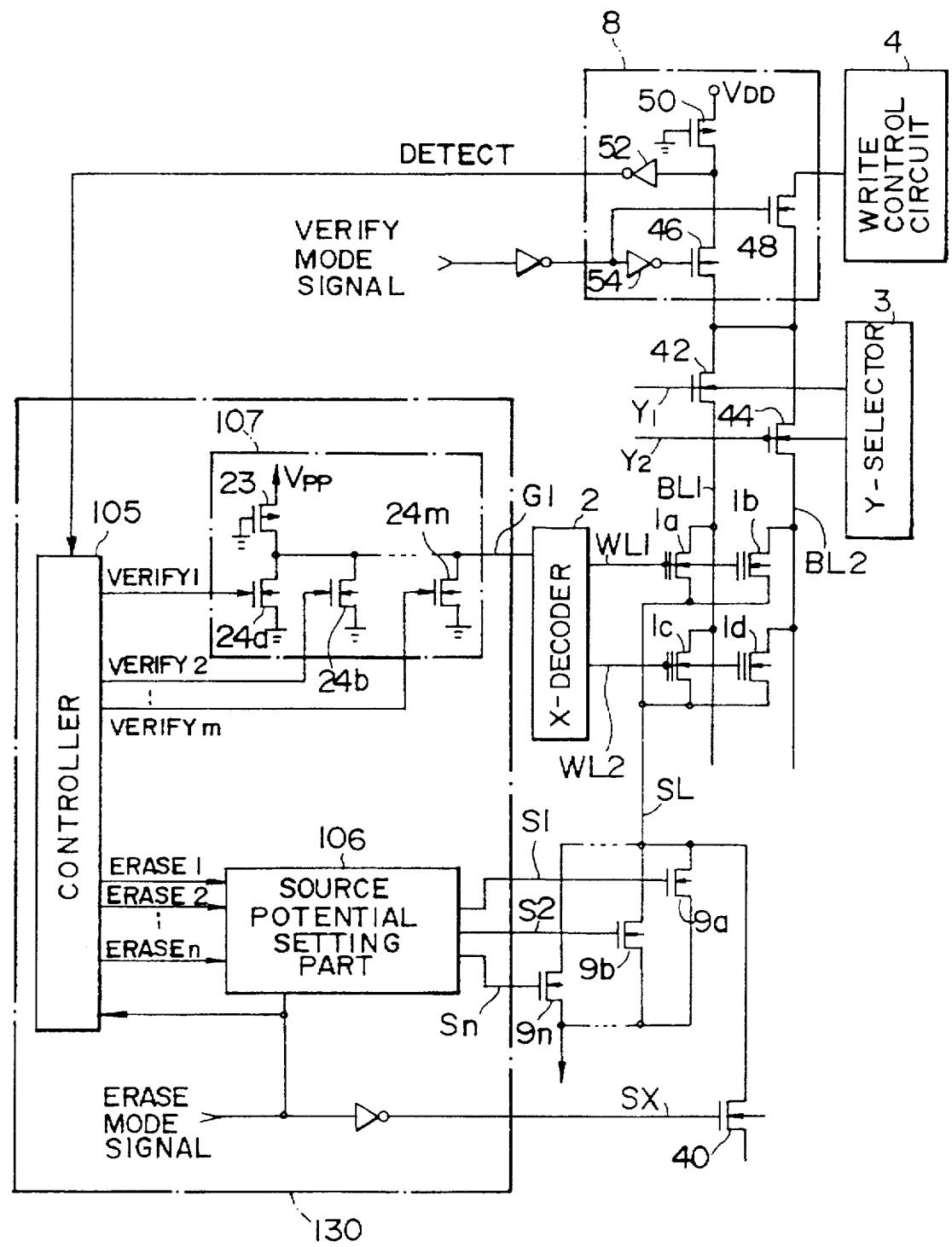
FIG. 6 is a circuit diagram of the second embodiment of a nonvolatile semiconductor device constructed in accordance with the present invention.

FIG. 6 shows the second embodiment of the present invention which is different from the first embodiment only in that the second embodiment comprises a potential difference setting section 130 and transistors 9a–9n connected to the source line SL. Parts similar to those of the first embodiment is denoted by the same reference numerals and will not further he described.

The transistors 9a–9n are of N-ch type and manufactured to have different threshold voltages. The transistors 9a–9n are connected parallel to the source line SL. Signals S1–Sn from the potential difference setting section 130 are coupled to the gate electrodes of the transistors 9a–9n, respectively.

The potential difference setting section 130 comprises a control part 105, a source potential setting part 106 and a gate potential setting part 107. The control part 105 generates Verify 1–Verify m signals and Erase 1–Erase n signals all which are used to control the gate and source potential setting parts 107 and 106. The control parts 105 also receives Detect signals from the verily circuit 8 and erase mode signals. The gate potential setting part 107 comprises a pull-up P-ch transistor 23 and N-ch transistors 24a–24m. On the verifying operation the gate potential setting part 107 can set the signal G1 at different verify voltages corresponding to Verify 1–Verify m signals.

The source potential setting part 106 are responsive to Erase 1–Erase n signals from the control part 105 to control the gate electrodes of the transistors 9a–9n. Thus, the potential in the source line SL, can be set at a desired value.

The operation of the second embodiment will now be described.

The erasing operation is first described. On the erasing operation, the erase mode signal is set at H level while the verify mode signal is set at L level. The outputs Y1 and Y2 of the Y-selector 3 are set at L level while the outputs WL1 and WL2 of the X-decoder 2 are set at GND level. Under such a condition, a given erasing voltage is applied to the source line SL to initiate the erasing operation to the memory transistors 1a–1d when any one of the signals S1–Sn is set at H level by the source potential setting part 106. The transistors 9a–9n are manufactured to have different threshold voltages Vthn. For example, if the signal S1 becomes H level and when one transistor 9a is turned on, the erasing voltage in the source line Sl, is reduced to Vpp-Vthl corresponding to the threshold voltage of the transistor 9a. Similarly, if the signal Sn becomes H level, the potential in the source line SL will be set at an erasing voltage Vpp-Vthn. By selecting the signals S1–Sn, therefore, different erasing voltages can be set in the memory transistors 1a–1n. As a result, the memory transistors 1a–1d can be erased with different erasing voltages, respectively.

FIG. 2C shows a potential difference which is applied to the memory transistors 1a–1d depending on the erase mode. Erase 1–Erase n. The magnitude of the potential difference is reduced as the erase mode is being changed from Erase 1 mode to Erase n mode. Erase 1–Erase n signals for setting Erase 1 mode –Erase n mode are formed by the control part 105 corresponding to Verify 1–Verify m signals. The correspondence between the erase mode signals and the verify mode signals may be carried out by any suitable manner, as described with reference to the first embodiment.

The verifying operation is then described.

On the verifying operation, the erase mode signal is set at L level while the verify mode signal is set at H level. As described, a memory transistor to be verified is selected by the X-decoder 2 and Y-selector 3. The verify circuit 8 then judges whether the threshold voltage of the selected memory transistor is higher or smaller than a verify voltage VF (Verify 1) set by the gate potential setting part 107. If it is judged that the threshold voltage is higher than the verify voltage VF, Detect signal becomes L level to perform the erasing operation with an erasing voltage corresponding to the Erase 2 signal, as in FIG. 3. The verifying operation is again carried out with the verify voltage (Verify 1). Such a procedure is repeated until the Detect signal becomes H level. At this time, the next memory transistor is selected and subjected to the same procedure.

When the threshold voltages of all the memory transistors 1a–1d become equal to or lower than the verify voltage VF (Verify 1) the verifying operation is re-initiated with the next verify voltage VF (Verify 2). When the verifying operation with the final verify voltage VF (Verify n) terminates, all the erasing operation will be terminated.

The second embodiment may use any suitable waveform of the potential difference applied to the memory transistors 1a–1d, other than that of FIG. 2C. For example, such a waveform as shown in FIG. 2D may be used so that after a pulse waveform having a predetermined potential difference has been initially applied to the memory transistor, the potential difference is gradually reduced depending on the difference of the memory transistor. In such a case, the initial potential difference to be applied is larger to set the threshold voltage of the memory transistor closer to a desired verify voltage. Thereafter, the erasing/verifying operation is carried out with a pulse waveform having very small potential difference. This can greatly reduced time required to perform the erasing/verifying operation.

Further, the present invention can cause a potential difference to be applied to the memory transistor while changing both the magnitude of potential difference and the length of application time, as shown in FIG. 2E. In such a case, the source potential setting part 106 of the second embodiment is adapted to generate pulse waveforms having different application times, as in the source potential setting part 6 of the first embodiment. Thus, the pulse waveforms having different application times can be set respectively at signals Sl–Sn so that a potential difference having such a waveform as shown in FIG. 2E can be applied to the memory transistors 1a–1d. In such an arrangement, waveforms having n kinds of different application times may be combined with waveforms having m kinds of different potential differences to form potential differences having n×m patterns of waveform which may be applied to the memory transistors 1a–1d. As a result, the erasing operation can more precisely be controlled while the number of hardwares can be reduced.

Figure 4B:
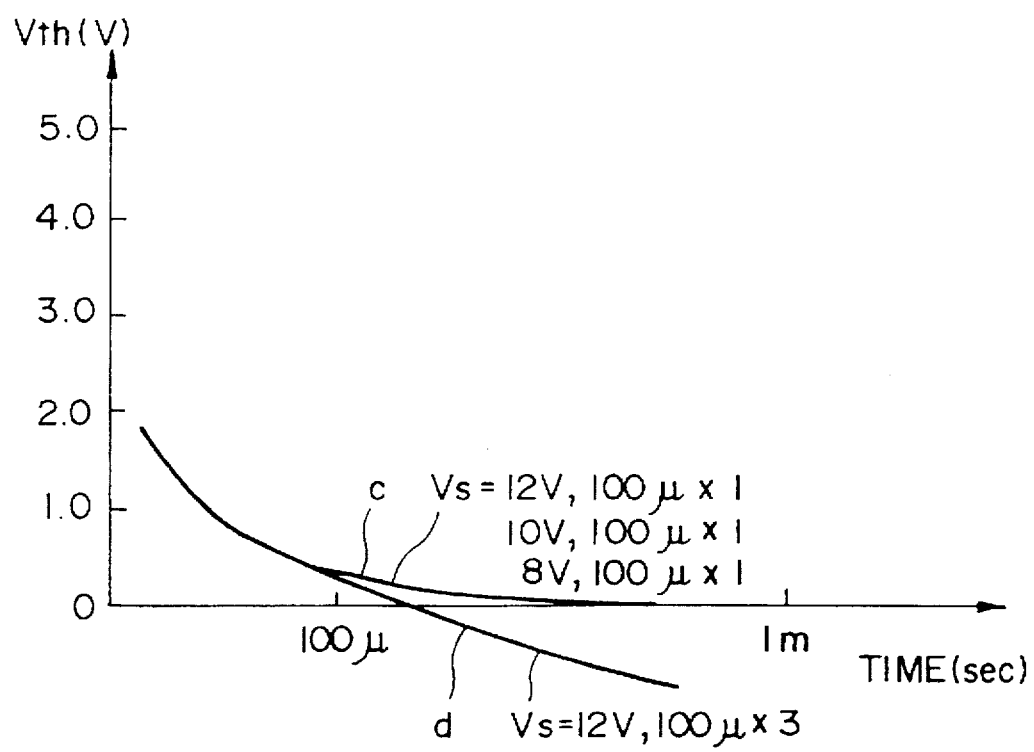

FIG. 4B shows a characteristic curve c representing variations in threshold voltage when the potential difference Vs is gradually reduced from 12 V through 10 V to 8 V and when the application time Ts is equal to 100μ (sec.). FIG. 4B also shows a characteristic curve d representing variations in threshold voltage when the potential difference Vs is equal to 12 V and the application time Ts is equal to 100μ×3 (sec.). As can be seen from FIG. 4B, if the magnitude of the potential difference is controlled depending on the magnitude of the threshold voltage, the shift of the threshold voltage can be controlled to be gradually reduced as the threshold voltage decreases, as in the first embodiment. Therefore the overerasing can effectively be prevented and time required to perform the entire erasing operation can be optimized, as in the first embodiment.

(3) Third Embodiment

Figure 7:
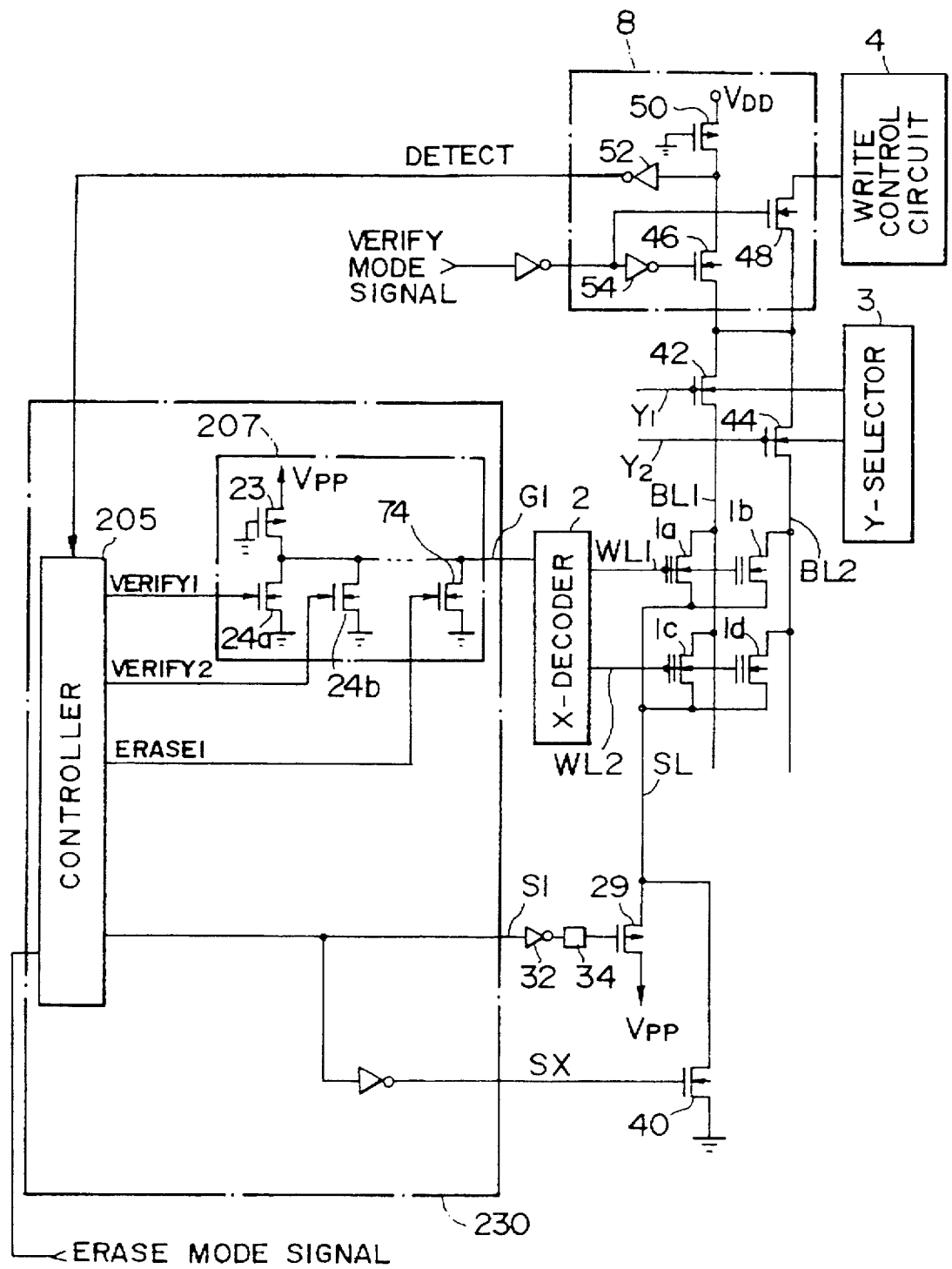
FIG. 7 is a a circuit diagram of the third embodiment of a nonvolatile semiconductor device constructed in accordance with the present invention.

FIG. 7 shows the third embodiment of the present invention which is different from the first embodiment only in that the third embodiment comprises a potential difference setting section 230.

The potential difference setting section 230 comprises a control part 205 and a gate potential setting part 207. The control part 205 functions to control the gate potential setting part 207 and also to ON/OFF control the transistors 29 and 40 and receives Detect signals from the verify circuit 8 and erase mode signals. The gate potential setting part 207 comprises a pull-up P-ch transistor 23 and N-ch transistors 24a, 24b and 74. The gate potential setting part 207 enables potential differences corresponding to Verify 1 and 2 signals and Erase 1 signal to be applied to the memory transistors 1a–1d on the erasing/verifying operation. The third embodiment can control the potential difference applied to the memory transistors 1a–1d without such a source potential setting part as shown in the first and second embodiments. In other words, the gate potential setting part 207 can set potentials to be applied to the control gate electrodes of the memory transistors 1a–1d such that the erasing/verifying operation can be controlled.

Figure 8:
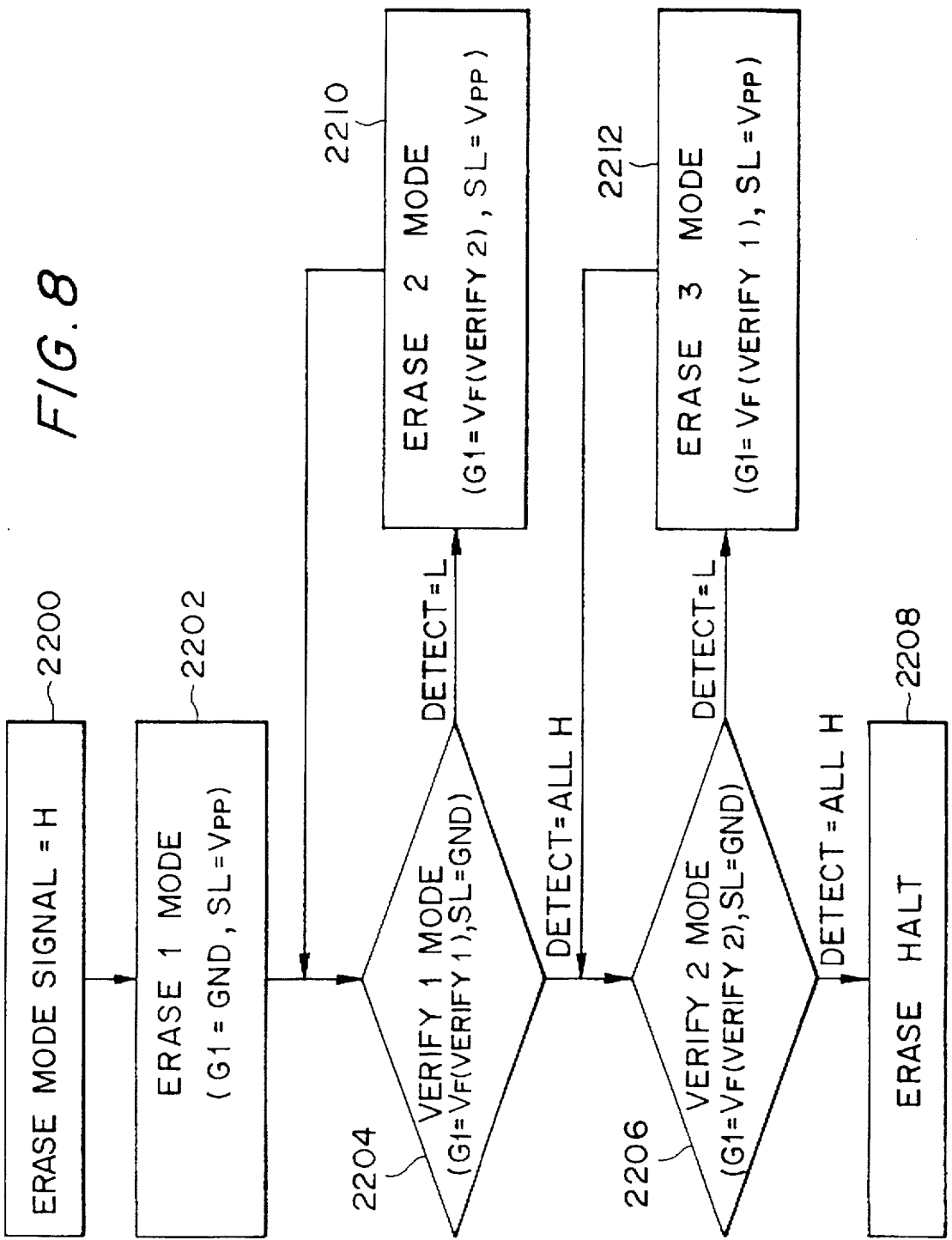
FIG. 8 is a flowchart illustrating one operation in the third embodiment.

The operation of the third embodiment will now be described briefly with reference to a flowchart show in FIG. 8.

At step 2200, the erase mode signal is first set at H level. At step 2202, the control part 205 outputs Erase 1 signal to establish Erase 1 mode. Thus, the signal G1 is set at GND level and the source line SL is set, for example, at Vpp=12 V. As a result, the potential difference of 12 V will be applied to the memory transistors 1a–1d to erase them. At step 2204, the control part 205 outputs Verify 1 signal to establish Verify 1 mode. Thus, the signal G1 is set, for example, at VF (Verify 1)=5 V and the source line SL is set at GND level. Therefore, the verifying operation will be initiated with the potential difference of 5 V.

At step 2204, if the threshold voltage of a memory transistor is higher than VF (Verify 1)=5 V and Detect signal is at L level the mode is changed to Erase 2 mode, as shown in step 2210. In the Erase 2 mode, the signal G1 is set, for example, at VF (Verify 2)=3.2 V and the source line SL is set at Vpp=12 V. Thus, a potential difference, 12 V–3.2 V=8.8 V, will he applied to the memory transistors 1a–1d to erase them. After the erasing operation in the Erase 2 mode, Verify 1 signal is again outputted to establish Verify 1 mode, as shown in step 2204. Thus, the verifying operation will be initiated with a potential difference, VF (Verify 1)=5 V.

Such a procedure is carried out for all the memory transistors 1a–1d. Once Detect signals corresponding to all the memory transistors 1a–1d become H level, Verify 2 signal is outputted to establish Verify 2 mode, as shown in step 2206. Thus, the verifying operation will be initiated with a potential difference, VF (Verify 2)=3.2 V.

If Detect signal becomes L level during the verifying operation in the Verify 2 mode, the erasing operation is carried out in Erase 3 mode, as shown in step 2212. In the Erase 3 mode, the signal G1 is set, for example, at VF (Verify 1)=5 V and the source line SL is set at Vpp=12 V. Thus, a potential difference, 12 V–5 V=7 V, is applied to the memory transistors 1a–1dto erase them. After the erasing operation has been made with the potential difference in the Erase 2 mode, the verifying operation is re-initiated in Verify 2 mode. When Detect signals corresponding to all the memory transistors 1a–1d become H level, that is, when the threshold voltages of all the memory transistors 1a–1d become equal to or lower than VF (Verify 2)=3.2 V, all the erasing operation will be halted, as shown in step 2208.

As will be apparent from the above description, the third embodiment can control both the erasing and verifying operations simply by causing the gate potential setting part 207 to control the potential difference at the control gate electrode. Therefore, the number or circuits can be reduced while the control process can be simplified with reduced time required to design the nonvolatile semiconductor device.

(4) Fourth Embodiment

Figure 9:
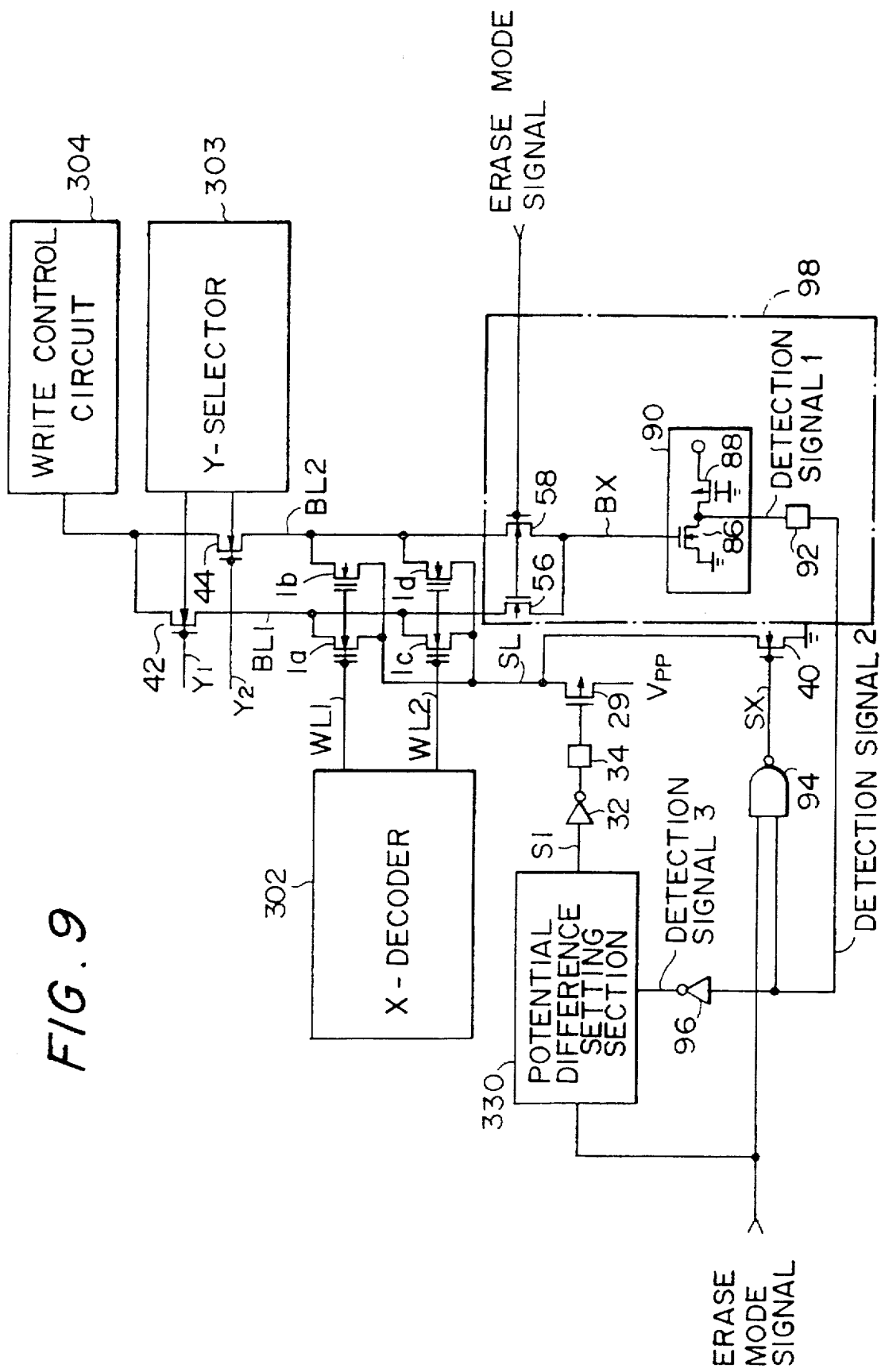
FIG. 9 is a circuit diagram of the fourth embodiment of a nonvolatile semiconductor device constructed in accordance with the present invention.

FIG. 9 shows the fourth embodiment of the present invention which comprises memory transistors 1a–1d, an X-decoder 302, a Y-selector 303, a write control circuit 304, transistors 29, 40, 42 and 44, an erasing halt means 98, a NAND 94, inverters 32 and 96, an interface circuit 34 and a potential difference setting section 330. The fourth embodiment as well as the fifth embodiment which will be described later does not comprise the verifying operation unlike the first to third embodiments.

The selection of the memory transistors 1a–1d is accomplished by the X-decoder and Y-selector 302, 303. Writing to the memory transistors 1a–1d is controlled by the write control circuit 304.

The erasing halt means 98 comprises N-ch transistors 56 and 58, a threshold voltage detector 90 and a latch 92. The threshold voltage detector 90 is adapted to detect the potentials in bit lines BL1 and BL2 when the transistors 56 and 58 are energized on the erasing operation. The threshold voltage detector 90 comprises a pull-up P-ch transistor 88 and an N-ch transistor 86. When any one of the memory transistors 1a-1d is energized on the erasing operation, the threshold voltage detector 90 generates a detection signal 1 at L level.

The detection signal 1 that is the output or the threshold voltage detector 90 is latched by the latch 92 and then inputted to the NAND 94 and inverter 96 as a detection signal 2. The output SX of the NAND 94 is then applied to the transistor 40 while the output or the inverter 96 is supplied to the potential difference setting section 330 as a detection signal 3.

The potential difference setting section 330 also receives an erase mode signal in addition to the detection signal 3 to generate a signal S1 of pulse waveform. The signal S1 is then sent to the P-ch transistor 29 through the inverter and interface circuit 32 34, so that a potential difference will be set between the control gale electrodes and the source regions in the memory transistors 1a-1d.

The operation of the fourth embodiment will now be described.

On the writing operation, the erase mode signal is set at L level. A memory transistor to be written is selected by the X-decoder 302 and Y-selector 303. The write control circuit 304 then supplies a given potential to that memory transistor to write it.

On the erasing operation, the erase mode signal is set at H level. Further, the outputs WL1 and WL2 of the X-decoder 302 are set, for example, at WL1=WL2=0.5 V and the outputs Y1 and Y2 of the Y-selector 303 are set at L level.

As a result of this, the bit lines BL1 and BL2 are set at Open level and the word lines WL1 and WL2 are set at 0.5 V and the source line SL is set at Open level. Under such a condition, the potential difference setting section 330 outputs a signal S1. Each time when the signal S1 becomes H level, the transistor 29 is turned on to apply a potential of Vpp level to the source regions of the memory transistors 1a-1d. Therefore, the erasing operation will be carried out for the memory transistors 1a-1d.

As the erasing operation proceeds to reduce the threshold voltages of the memory transistors 1a-1d and if the threshold voltage in any one of the memory transistors becomes equal to or lower than 0.5 V, that memory transistor is turned on. Thus, the potential BX shown in FIG. 9 increases. When the potential BX becomes, for example, 0.8 V or higher, the transistor 86 is turned on to render the detect ion signal 1 L level. As a result, the detection signal 2 becomes L level and the transistor 40 is turned on. At the same time, the potential difference setting section 330 receives the detection signal 3 that has become H level. Thus, the potential difference setting section 330 sets the signal S1 at GND level to halt the erasing operation.

Figure 5:
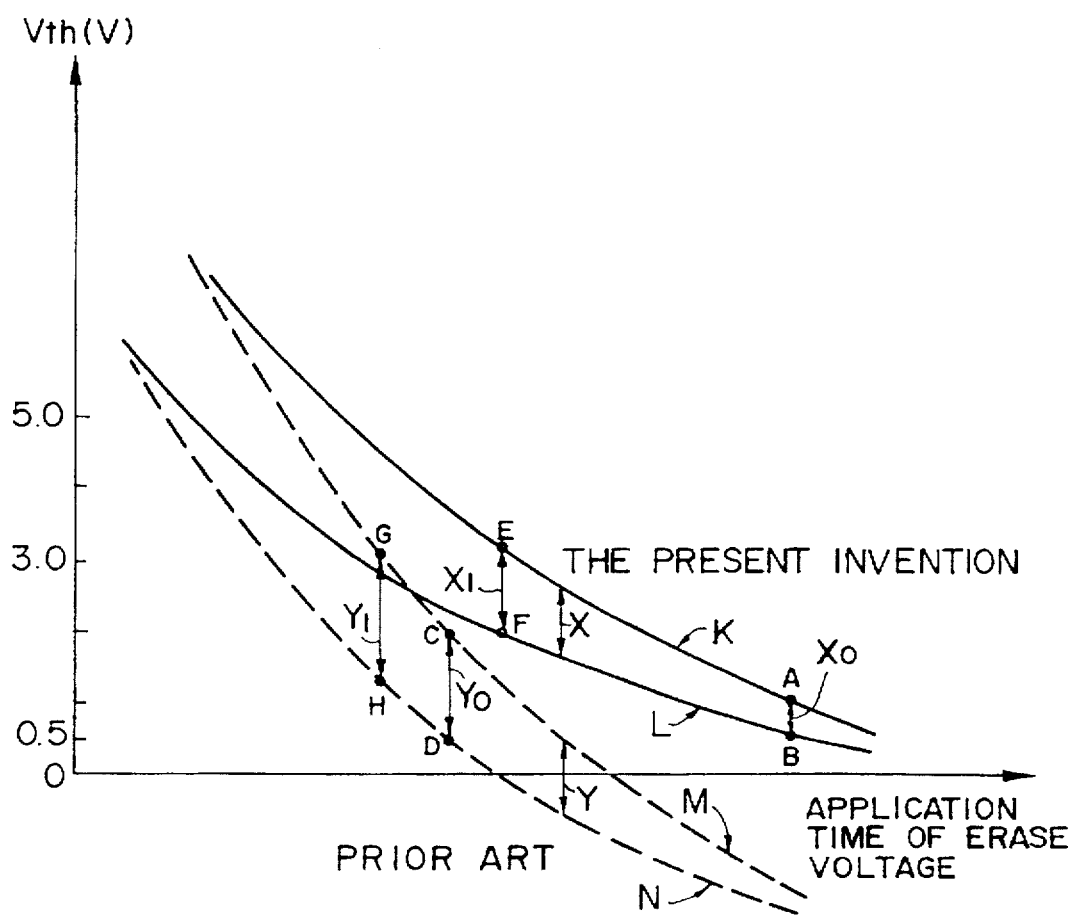
FIG. 5 is a graph showing variations in threshold voltage relative to the application time of erasing voltage.
Figure 10:
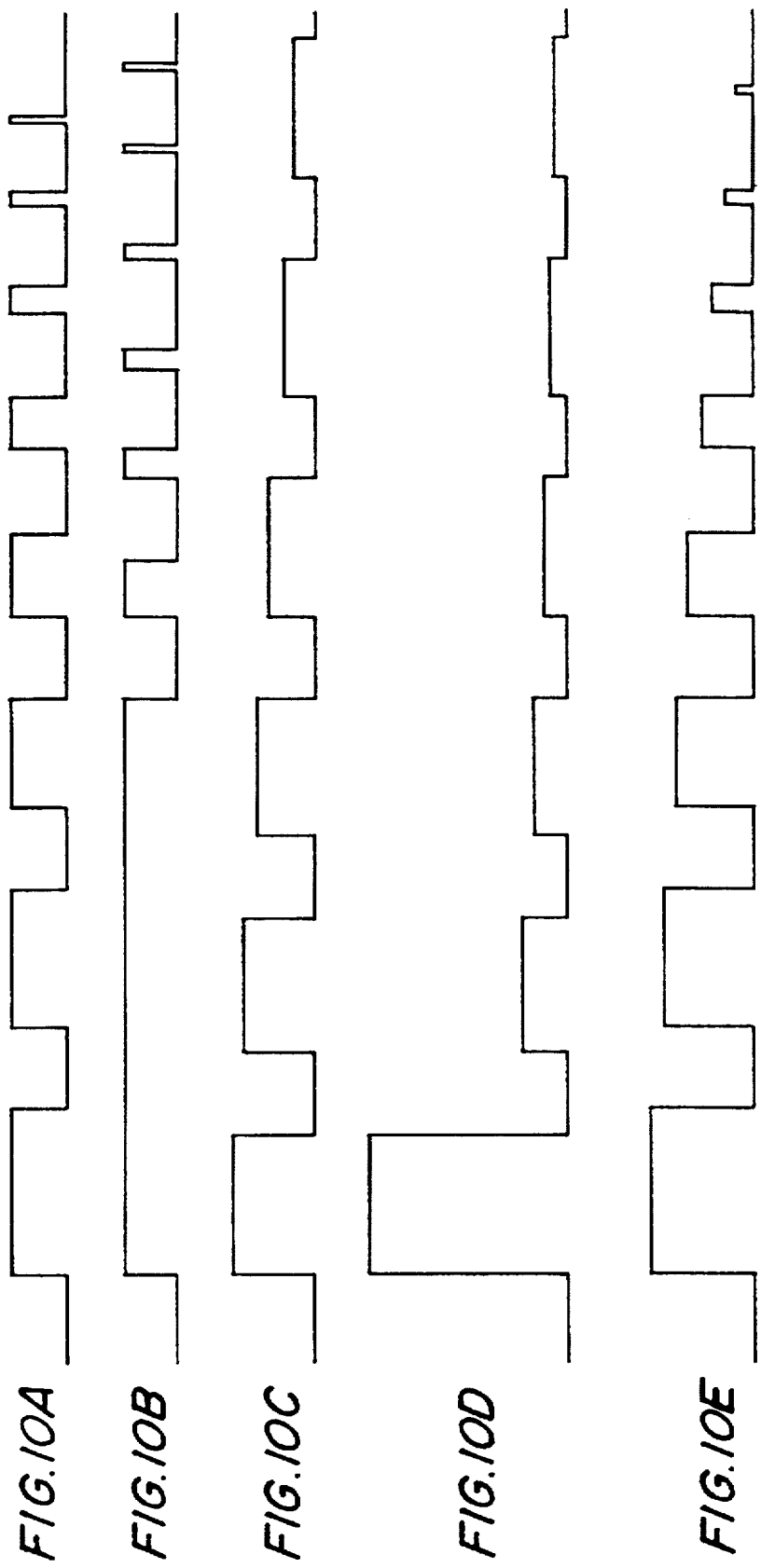
FIGS. 10A–10E are diagrams showing waveforms that represent various potential differences settable in a memory transistor.

In the fourth embodiment, the potential difference of such a waveform as shown in FIG. 10A is applied to the memory transistors 1a-1d. As can be seen from this figure, the waveform is configured to reduce the application time as the erasing operation proceeds. The application of such a potential difference can reduce the shift of the threshold voltage as the erasing operation proceeds, as in the first embodiment. FIG. 5 shows such a procedure.

FIG. 5 is a characteristic diagram showing the reduction of threshold voltage in the memory transistor depending on the application time of erasing voltage. In FIG. 5, characteristic curves M and N represent reductions of threshold voltages respectively in most slowly and fastly erasable memory transistors according to the prior art. Characteristic curves K and L represent reductions of threshold voltages respectively in most slowly and fastly erasable memory transistors according to the fourth embodiment of the present invention. As can be seen from FIG. 5, the characteristic curves K and L have gradients smaller than those of the prior art characteristic curves M and N to provide decreasing shift of the threshold voltage in the negative direction. As can he seen from FIG. 5, further, the ranges X and Y in varying threshold voltage between the most slowly and fastly erasable memory transistors decrease as the threshold voltage is being reduced. This is for the following reason:

It is now assumed that the potential at the floating gate electrode of the most slowly erasable memory transistor is −5 V and that the potential at the floating gate electrode of the most fastly erasable memory transistor is −3 V. The threshold voltage of each of the memory transistors is determined depending on tile number of electrons accumulated in tile floating gate electrode or the potential at the floating gate electrode. In this case, therefore, the slowly erasable memory transistor will have its threshold voltage higher than that of the fastly erasable memory transistor. If a potential equal to 10 V is applied to the source regions of the memory transistors under such a condition, the potential difference Vfs between the floating gate electrode and the source region in the slowly erasable memory transistor becomes 15 V while the potential difference Vfs in the fastly erasable memory transistor becomes 13 V. Normally, the amount of electrons released by the tunnel current, that is, the shift of the threshold voltage in the negative direction increases with increase of the potential difference Vfs. In such a case, therefore, the slowly erasable memory transistor will have its increased shift in the negative direction. When the threshold voltage is shifted to any negative level in such a manner, the potentials at the floating gate electrodes or the memory transistors become, for example, −4 V and −2.5 V, respectively. The threshold voltages in both the memory transistors approach each other. Since the potential differences Vfs or the respective memory transistors become 14 V and 12.5 V respectively in the next erasing operation, the slowly erasable memory transistor will be more shifted in the negative direction than the fastly erasable memory transistor, as in the previous erasing operation. As a result, the threshold voltages in these memory transistors will further approach each other. As the erasing operation proceeds in such a manner, the threshold voltages in the memory transistors gradually approach each other such that the ranges X and Y in varying threshold voltage between the characteristic curves K and L; M and N are reduced, as shown in FIG. 5.

The fourth embodiment reduce the application time of potential difference as the erasing operation proceeds. Thus, the gradients of the characteristic curves K and L can be decreased as the threshold voltage decreases, as shown in FIG. 5. As a result, the range X0 in varying threshold voltage between the characteristic curves K and L can sufficiently be reduced when the threshold voltage of the fastly erasable memory transistor becomes equal to or lower than 0.5 V to actuate the erasing halt circuit 90 (at a point B in FIG. 5). At this point, therefore, the threshold voltage or the most slowly erasable memory transistor can he equal to or lower than 1.3 V (at a point A). As a result, the operational margin or lower limit in read-out or data can sufficiently be secured to improve the velocity and stability in read-out.

On the contrary, the prior art can perform the erasing operation with the potential difference only through the same application time. Even if the threshold voltage decreases, therefore, the gradients in the characteristic curves M and N could not be reduced much compared with the fourth embodiment of the present invention. When the threshold voltage or the fastly erasable memory transistor becomes, for example, equal to or lower than 0.5 V (at a point D in FIG. 5), the range Y0 in varying threshold voltage between the characteristic curves M and N remains larger, so the slowly erasable memory transistor will have its threshold voltage equal to about 2.0 V (at a point C). Thus, the prior art cannot have a sufficiently operational margin of lower limit, compared with the fourth embodiment of the present invention. Particularly, where the threshold voltages are dispersed die to variations in the process to increase the range Y in varying threshold voltage between the slowly and fastly erasable memory transistors, such dispersion cannot be absorbed by the prior art. This leads to very high possibility of failure in read-out. On the contrary, the fourth embodiment can absorb the dispersion in the distribution of threshold voltage due to variations in the process to improve the yield and reliability.

As above, due to the relationship shown in the characteristic curve in FIG. 5, it is possible to guarantee the threshold voltage of the slowest erasing speed memory transistor being no more than a certain value if the measured threshold voltage value of the fastest erasing speed memory transistor is known. Likewise, it is possible to guarantee the threshold voltage of the fastest erasing speed transistor being no less than a certain value if the measured threshold voltage value of the slowest erasing speed memory transistor is known. For example, in the characteristic curves M and N of FIG. 5, the threshold voltage of the fastly erasable memory transistor will be 1.2 V (at a point II in FIG. 5) when the slowly erasable memory transistor is, for example, 3.2 V (at a point G). Therefore, a sufficient margin against the overerasing cannot be taken. In the characteristic curves K and L, however, the threshold voltage of the fastly erasable memory transistor becomes 1.8 V (at a point F in FIG. 5) when the threshold voltage of the slowly erasable memory transistor becomes 3.2 V (at a point E). Therefore, a sufficient margin against the overerasing can be taken to improve the yield and reliability.

The fourth embodiment may use any suitable waveform of the potential difference other than that of FIG. 10A. For example, as shown in FIG. 10B, the application time may gradually be reduced depending on the threshold voltage of the memory transistor after a pulse waveform having a given length has been initially applied to the memory transistor. In such a case, if the initial pulse waveform to be applied is maintained relatively tong and then the erasing operation is initiated with a pulse waveform through very short application time, time required to perform the erasing operation may greatly be reduced.

Figure 11:
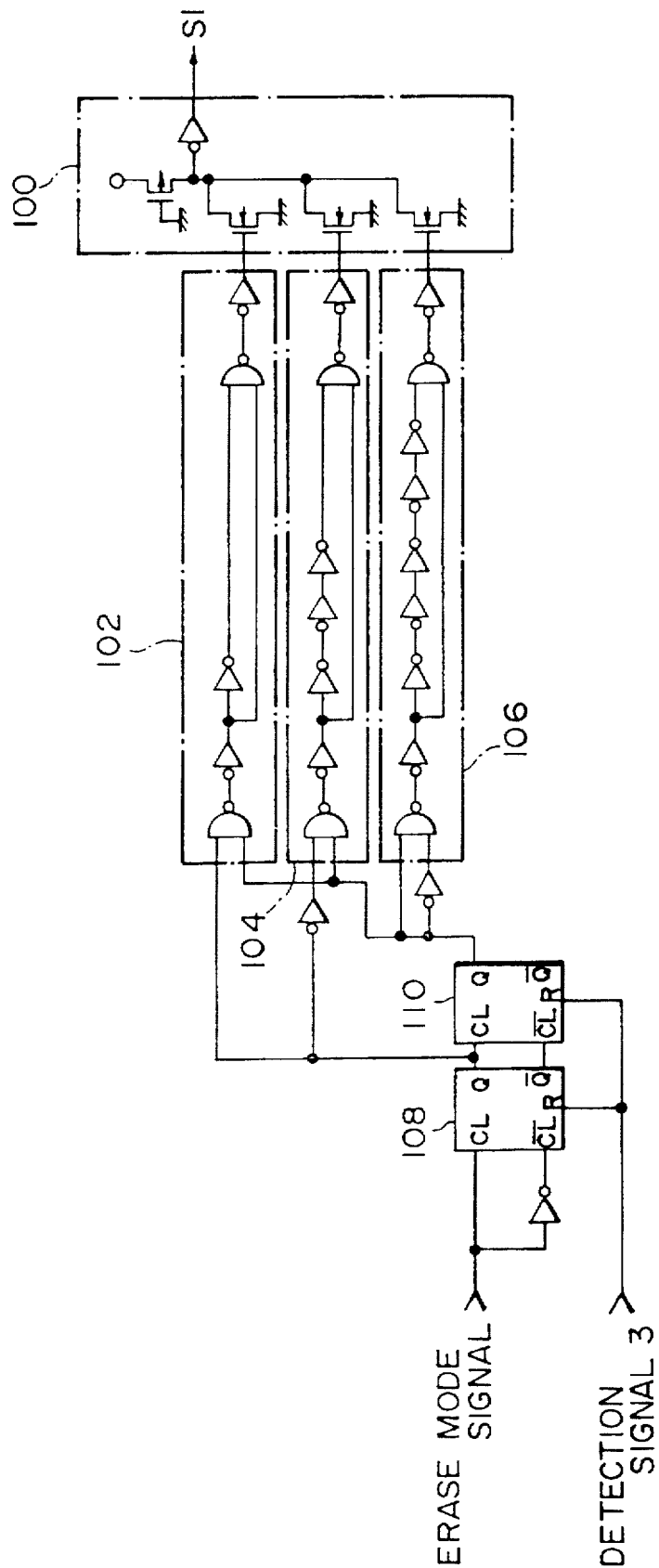
FIG. 11 is a circuit diagram showing the arrangement of a potential difference setting section in the fourth embodiment.
Figure 12:
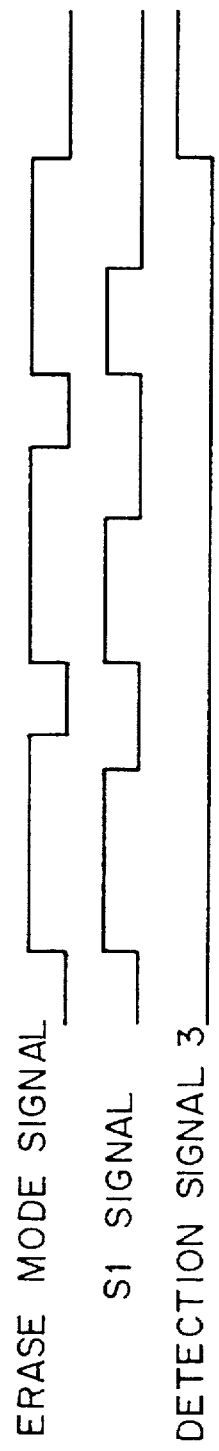
FIG. 12 is a timing chart illustrating the operation of the potential difference setting section shown in the fourth embodiment.

FIG. 11 shows a concrete circuit arrangement of the potential difference setting section 330 while FIG. 12 shows a timing chart in the operation of this circuit. As shown in FIG. 11 the potential difference setting section 330 comprises a pulse output circuit 100, pulse generating circuits 102, 104 and 106, and flip flops 108 and 110.

The pulse output circuit 100 is adapted to output a signal S1 of H level each time when a pulse waveform is inputted into the pulse output circuit 100 from any one of the pulse generating circuits 102, 104 and 106. Each of the pulse generating circuits 102, 104 and 106 is responsive to an input signal from the corresponding one of the flip flops 108 and 110 to generate a pulse waveform having a given width. In this case, the pulse generating circuit 106 generates a pulse waveform having the maximum width while the pulse generating circuit 102 generates a pulse waveform having the minimum width.

The erase mode signal is inputted into the CL terminal (stock terminal) of the flip flop 108, the output of which in turn is inputted into the CL terminal of the rearward flip flop 110. The R terminal (reset terminal) of the flip flop 108, 110 receives the detection signal 3 to be reset.

In such an arrangement, the signal S1 having such a waveform as shown in FIG. 12 is outputted from the potential difference setting section 330. As can be seen from FIG. 12, the signal S1 having a given pulse width is outputted from the potential difference setting section 330 each time when the erase mode signal becomes H level. The pulse width of the signal S1 is gradually reduced as the number of erasures increases. In such a manner, the shift of the threshold voltage on the erasing operation can be reduced as the erasing operation proceeds.

(5) Fifth Embodiment

Figure 13:
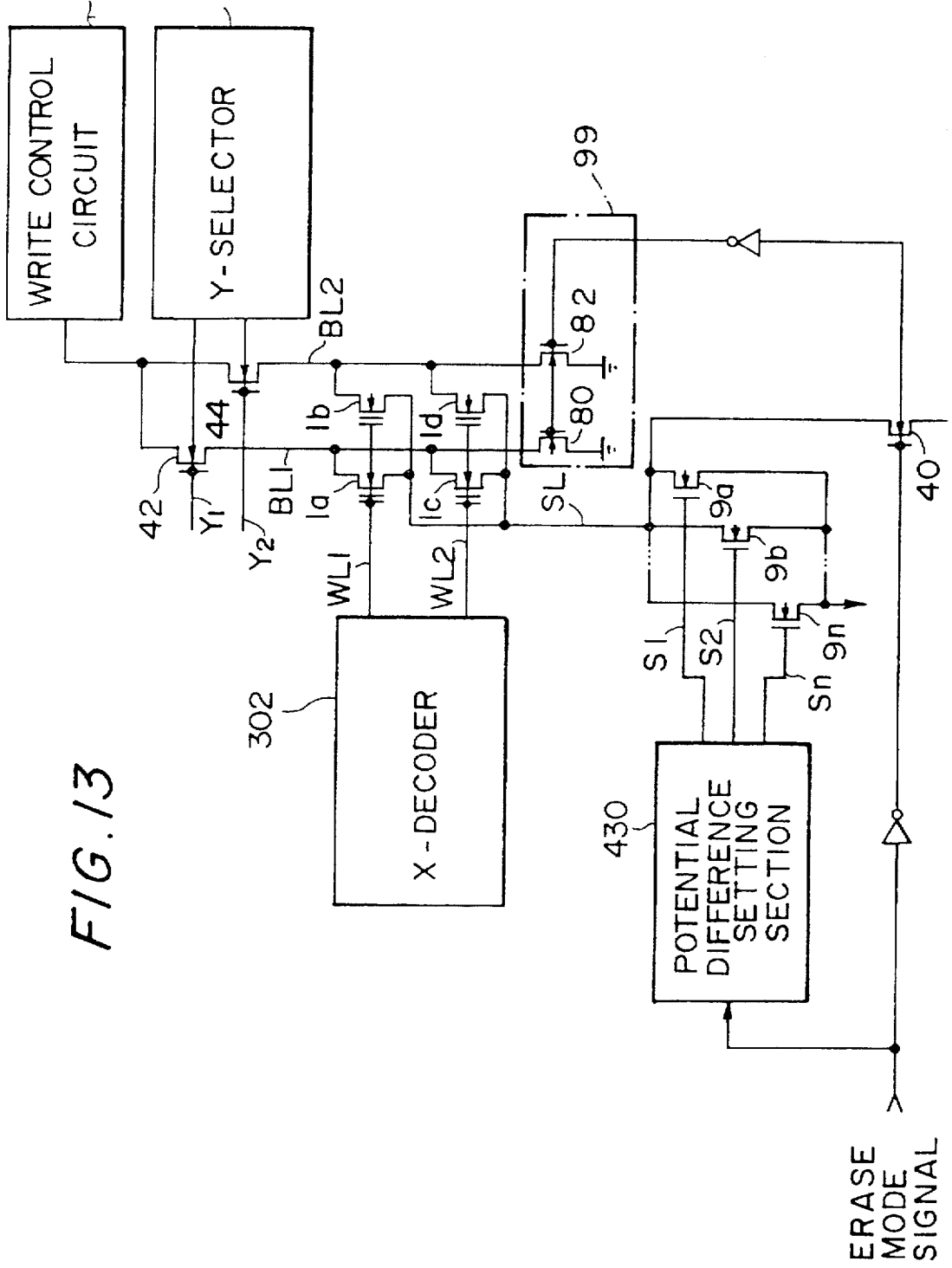
FIG. 13 is a circuit diagram of the fifth embodiment of a nonvolatile semiconductor device constructed in accordance with the present invention.

FIG. 13 shows the fifth embodiment of the present invention which is different from the fourth embodiment of FIG. 9 only in the structures of potential difference setting section 430, transistors 9a–9n connected to the source line S1 and erasing halt circuit 99.

The erasing halt circuit 99 comprises transistors 80 and 82. On the erasing operation, the transistors 80 and 82 are turned on. A potential of GND level is then applied to the bit lines BL1 and BL2. In this arrangement of the erasing halt circuit 99, the potential of the source line SL is drawn toward GND level to halt the erasing operation for all the memory transistors 1a–1d when any one of the memory transistors 1a–1d is turned on.

The transistors 9a–9n are of N-ch type and manufactured to have different threshold voltages. The transistors 9a–9n are connected parallel to the source line SL. Signals S1–Sn from the potential difference setting section 430 are coupled to the gate electrodes of the transistors 9a–9n.

The source potential setting part 430 is adapted to output sequentially the signals S1–Sn to the respective transistors 9a–9n each time when the erase mode signal becomes H level. The transistors 9a–9n are then sequentially turned on to apply the erasing voltage to the memory transistors 1a–1d to erase them. In this case, the transistors 9a–9n are manufactured to have different threshold voltages Vthn. When the signal S1 becomes H level and if the transistor 9a is turned on, the erasing voltage set in the source line SL is reduced to a level Vpp-Vth1 corresponding to the threshold voltage of the transistor 9a. If the signal Sn becomes H level, similarly, the source line SL will be set at the erasing voltage Vpp-Vthn.

The operation of the fifth embodiment will now be described.

The description of the writing operation, which is carried out in the same manner as that of the fourth embodiment, is omitted.

On the erasing operation, the erase mode signal is set at 11 level. The outputs WL1 and WL2 or the X-decoder 302 are set, for example, at 0.5 V while the outputs Y1 and Y2 of the Y-selector 303 are set at L level. The bit lines BL1 and BL2 are set at GND level by the erasing halt circuit 99.

Under such a condition, the potential difference setting section 430 outputs a signal S1. The transistor 9a is then turned on while a potential or Vpp-Vth1 level is applied to the source regions of the memory transistors 1a–1d. Thus, the erase operation for the memory transistors 1a–1d is carried out. When it again becomes H level, after the erase mode signal has become L level, the signal S2 from the potential difference setting section 430 is set at H level. As a result, a potential of Vpp-Vth2 level is applied to the source regions of the memory transistors 1a–1d. Similarly, a potential of Vpp-Vthn is sequentially applied to the source regions of the memory transistors 1a–1d to erase them.

When the threshold voltages of the memory transistors 1a–1d decrease as the erasing operation proceeds and if the threshold voltage of any one or the memory transistors 1a–1d becomes equal to or lower than 0.5 V, that memory transistor is turned on. In such a case, the potentials of the bit lines BL1 and BL2 have been set at GND level by the transistors 80 and 82 of the erase halt circuit 99 as described above. Therefore, the potential of the source line SL is drawn toward GND level by the transistors 80 and 82 through the energized memory transistor so that the erase operation halts.

In the fifth embodiment, the potential difference or such a waveform as shown in FIG. 10C is applied to the memory transistors 1a–1d by the output signals S1–Sn from the potential difference setting section 430. As can be seen from this figure, the waveform is configured to reduce the potential difference as the erasing operation proceeds. The application of such a potential difference can reduce the shift of the threshold voltage relative to the application time of erasing voltage more than that of the prior art as in the fourth embodiment. As a result or this, the dispersion of the threshold voltage due to variations in the process is sufficiently absorbed so that a more reliable nonvolatile semiconductor device having large yield can be provided.

In the fifth embodiment, any suitable waveform of the potential difference other than that of FIG. 10C may be used. As shown in FIG. 10D for example, a potential difference may be gradually decreased depending on the threshold voltage of the memory transistor after the pulse waveform having a given length has been initially applied to that memory transistor. In such a case time required to perform the erasing operation can greatly be shortened if the initial potential difference to be applied is relatively large and if the erasing operation is carried out with a pulse waveform of very small potential difference.

Further, the present invention can cause a potential difference to be applied to the memory transistor while changing both the magnitude of potential difference and the length of application time as shown in FIG. 10E. In such a case, waveforms having n kinds of different application times may be combined with waveforms having m kinds of different potential differences to form potential differences having n×m patterns of waveform which may be applied to the memory transistors 1a–1d. As a result, the erasing operation can more precisely be controlled while the number of hardwares can be reduced.

The present invention is not limited to the aforementioned embodiments, but may be embodied in various modifications and changes within the scope of the present invention.

For example, the waveform of the potential difference applied to the memory transistors 1a–1d is not limited to such patterns as shown in FIGS. 2A–D and FIGS. 10A–D, but may be used in various other patterns.

The verifying technique is not limited to that in the embodiments of the present invention. The verifying operation may be carried out for each word line or for each bit line, rather than for each memory transistor. A plurality of such verify circuits 8 may be used to perform the verifying operations in parallel.

The Fourth and fifth embodiments have been described to use the erasing halt means for automatically halting the erasing operation. However, the present invention is not limited to such an arrangement, but may be constructed to halt the erasing operation after a preset number of erasing steps have been executed. Any, external controller may he provided to monitor whether or not any one of the memory transistors is overerased. If the memory transistor is overerased, the external controller may set the erase mode signal at L level to halt the erasing operation.

Figure 14A:
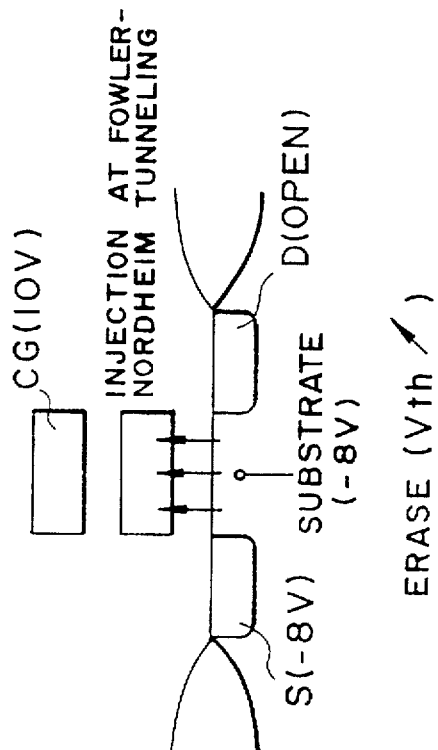
FIGS. 14A–14D are cross-sectional views of a memory transistor example which performs writing and erasing operations in a different manner from what was explained in the first to fifth embodiment.
Figure 14B:
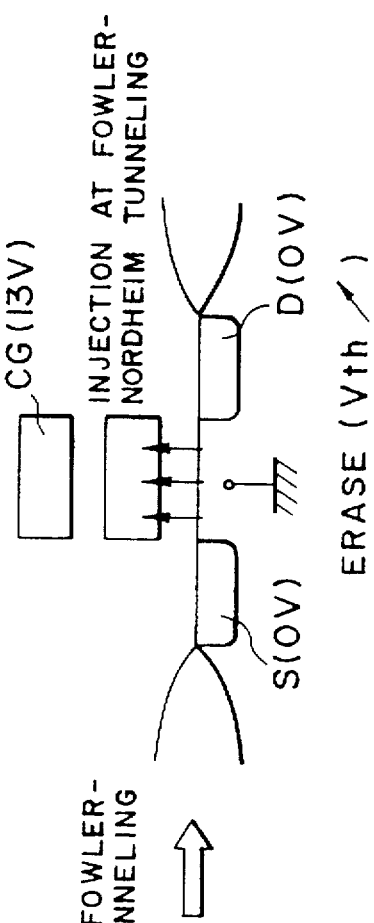
Figure 14C:
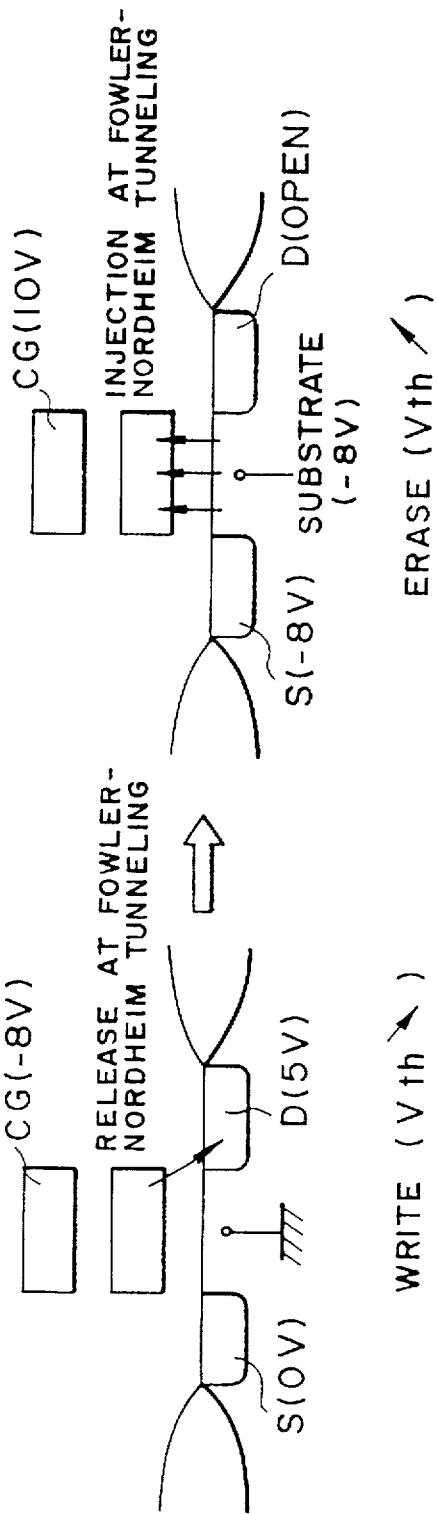
Figure 14D:
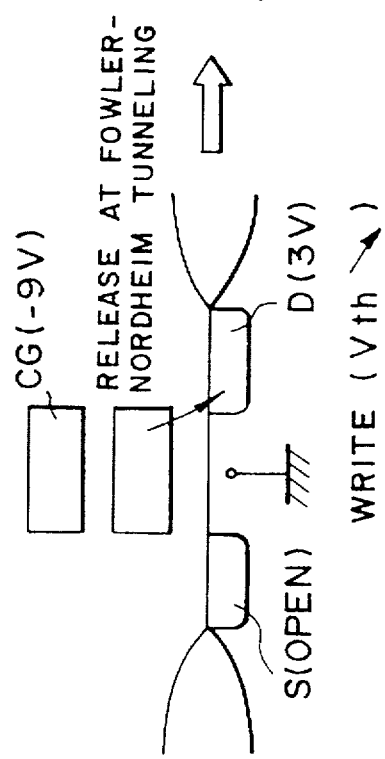
Figure 15:
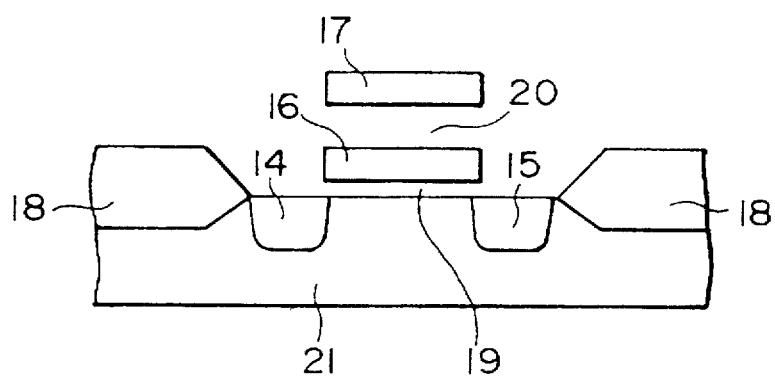
FIG. 15 is a cross-sectional view of a flash EEPROM.
Figure 16:
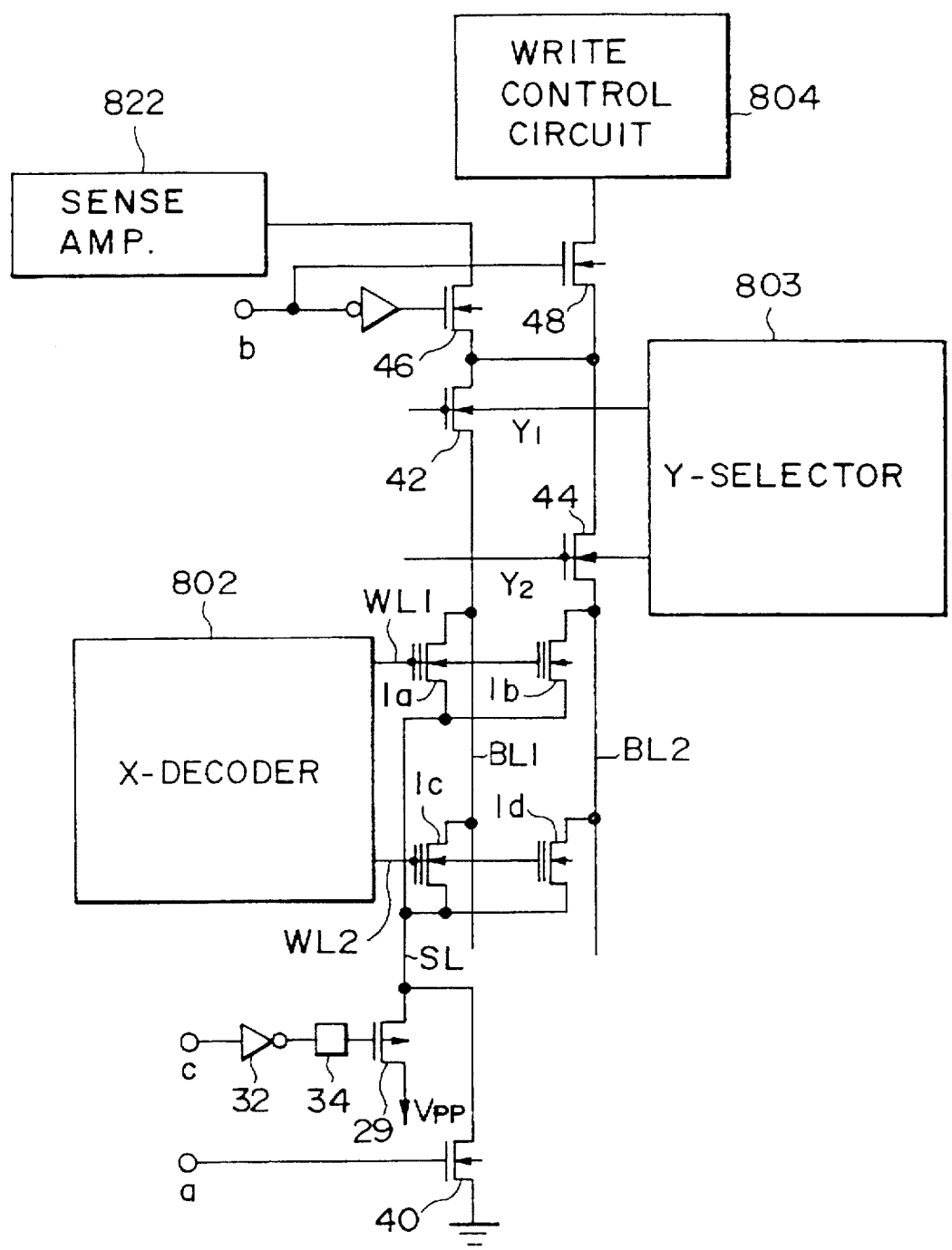
FIG. 16 is a circuit diagram of a nonvolatile semiconductor device constructed in accordance with the prior art.

Although the fifth embodiment have been described as to inject electrons into the floating gate electrode by the hot electrons on the writing operation and to release the electrons by the tunnel current on the erasing operation, the invention is not limited to such an arrangement. Any means that can at least perform the release and injection of electrons relative to the floating gate electrode to control the threshold voltage independently of the hot electrons or tunnel current may be applied to various memory cells in accordance with the present invention. Independently of the name of writing or erasing operation, the electrons may he injected into or released from any one of drain region, source region and semiconductor substrate. Therefore, the present invention may be applied to a memory cell of such a structure as shown in FIGS. 14A and B or FIGS. 14C and D. More particularly, FIGS. 14A and C show the writing operation performed by releasing electrons into the drain region by the use of tunnel current while FIGS. 14B and D show the erasing operation carried out by injecting electrons from the semiconductor substrate similarly by the use of tunnel current. The present invention may be applied to such structures without any problem.

We claim:

1. A method of performing injection or release of electrons in at least one memory transistor, said at least one memory transistor comprising a floating gate electrode, a control gate electrode and first and second diffusion layers, one of the injection of electrons and said release of electrons performing a writing operation and the other of said injection of electrons and said release of electrons performing an erasing operation, said method comprising the steps of:

applying at least one potential difference between said control gate electrode and said first diffusion layer to release the electrons;

detecting a threshold voltage of the at least one memory transistor after the release of electrons; and varying an application time of at least one subsequent potential difference applied between the control gate electrode and said first diffusion layer based on the detected threshold voltage.

2. The method of claim 1 wherein the at least one potential difference has a predetermined application time.

3. A method of performing injection or release of electrons in at least one memory transistor, said at least one memory transistor comprising a floating gate electrode, a control gate electrode and first and second diffusion layers, one of the injection of electrons and said release of electrons performing a writing operation and the other of said injection of electrons and said release of electrons performing an erasing operation, said method comprising the steps of:

applying at least one potential difference between said control gate electrode and said first diffusion layer to release the electrons;

detecting a threshold voltage of the at least one memory transistor after the release of electrons; and varying a magnitude of at least one subsequent potential difference applied between the control gate electrode and said first diffusion layer based on the detected threshold voltage.

4. The method of claim 3, wherein the at least one potential difference has a predetermined magnitude.

5. A nonvolatile semiconductor device comprising:

at least one memory transistor comprising:

a floating gate electrode, a control gate electrode, and first and second diffusion layers, the at least one memory transistor performing injection and release of electrons relative to said floating gate electrode, one of said injection of electrons and said release of electrons performing a writing operation and the other of said injection of electrons and said release of electrons performing an erasing operation;

a voltage applying device connected to said control gate electrode and said first diffusion layer, said voltage applying device applying at least one potential difference between said control gate electrode and said first diffusion layer to release the electrons; and a detector connected to said at least one memory transistor and said voltage applying device, said detector detecting a threshold voltage of the at least one memory transistor after the release of the electrons, said voltage applying device responding to the threshold voltage detected by said detector to vary an application time of at least one subsequent potential difference applied between the control gate electrode and said first diffusion layer.

6. The nonvolatile semiconductor device of claim 5, wherein the at least one potential difference has a predetermined application time.

7. The nonvolatile semiconductor device of claim 5, wherein said voltage applying device decreases the application time of the at least one subsequent potential difference.

8. A nonvolatile semiconductor device comprising:

at least one memory transistor comprising:

a floating gate electrode, a control gate electrode, and first and second diffusion layers, the at least one memory transistor performing injection and release of electrons relative to said floating gate electrode, one of said injection of electrons and said release of electrons performing a writing operation and the other of said injection of electrons and said release of electrons performing an erasing operation;

a voltage applying device connected to said control gate electrode and said first diffusion layer, said voltage applying device applying at least one potential difference between said control gate electrode and said first diffusion layer to release the electrons; and a detector connected to the at least one memory transistor and the voltage applying device, the detector detecting a threshold voltage of the at least one memory transistor after the release of the electrons, said voltage applying device responding to the threshold voltage detected by said detector to vary a magnitude of at least one subsequent potential difference applied between the control gate electrode and said first diffusion layer.

9. The nonvolatile semiconductor device of claim 8, wherein the at least one potential difference has a predetermined magnitude.

10. The nonvolatile semiconductor device of claim 8, wherein said voltage applying device controls a potential difference applied between said control gate electrode and said first diffusion layer during the release of the electrons and a verifying operation by changing a potential applied to said control gate electrode.

* * * * *